United States Patent
Zhu et al.

(10) Patent No.: US 6,939,751 B2
(45) Date of Patent: Sep. 6, 2005

(54) METHOD AND MANUFACTURE OF THIN SILICON ON INSULATOR (SOI) WITH RECESSED CHANNEL

(75) Inventors: Huilong Zhu, Poughkeepsie, NY (US); Bruce B. Doris, Brewster, NY (US); Werner A. Rausch, Stormville, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 10/605,726

(22) Filed: Oct. 22, 2003

(65) Prior Publication Data

US 2005/0090066 A1 Apr. 28, 2005

(51) Int. Cl.[7] .............................................. H01L 21/84
(52) U.S. Cl. ....................... 438/151; 438/300; 438/595
(58) Field of Search .................................. 438/151, 270, 438/295, 300, 589, 595; 257/347, 387

(56) References Cited

U.S. PATENT DOCUMENTS

| | | | |
|---|---|---|---|
| 4,616,400 A | | 10/1986 | Macksey et al. |
| 5,814,544 A | | 9/1998 | Huang |
| 6,063,677 A | * | 5/2000 | Rodder et al. ............... 438/300 |
| 6,225,173 B1 | | 5/2001 | Yu |
| 6,391,720 B1 | | 5/2002 | Sneelal et al. |
| 6,406,973 B1 | * | 6/2002 | Lee ............................ 438/416 |
| 6,465,311 B2 | | 10/2002 | Shenoy |
| 6,509,234 B1 | * | 1/2003 | Krivokapic ................. 438/270 |
| 6,583,000 B1 | * | 6/2003 | Hsu et al. ................... 438/222 |
| 2002/0142551 A1 | * | 10/2002 | Park et al. .................. 438/300 |
| 2003/0059995 A1 | * | 3/2003 | Hsu ............................ 438/199 |
| 2003/0189228 A1 | * | 10/2003 | Ieong et al. ................ 257/347 |

* cited by examiner

Primary Examiner—Stephen W. Smoot
(74) Attorney, Agent, or Firm—Graham S. Jones, II; H. Daniel Schnurmann

(57) ABSTRACT

An RSD FET device with a recessed channel is formed with a raised silicon sources and drains and a gate electrode structure formed on an SOI structure (a Si layer formed on a substrate) by the steps as follows. Form a SiGe layer over the Si layer and a RSD layer over the SiGe. Etch through the RSD layer and the SiGe to form a gate electrode space reaching down the Si layer. Form a pair of RSD regions separated by the gate electrode space. Line the walls of the gate electrode space with an internal etch stop layer and an inner sidewall spacers. Form a gate electrode inside the inner sidewall spacers on the Si layer. Form external sidewall spacers adjacent to the gate electrode between the RSD regions next to the inner sidewall spacers, and dope the RSD regions, whereby a recessed channel is formed in the SOI silicon layer between the raised source/drain regions thereabove and below the level of the SiGe layer.

19 Claims, 15 Drawing Sheets

METHOD AND MANUFACTURE OF THIN SILICON ON INSULATOR (SOI) WITH RECESSED CHANNEL

BACKGROUND OF INVENTION

This invention relates to methods of manufacture of SOI (Silicon-On-Insulator) MOSFET (Metal Oxide Semiconductor Field Effect Transistor) devices and more particularly to UT (Ultra-Thin) RSD (Raised Source and Drain) devices and to the structures manufactured thereby.

Thin silicon channel SOI device technology is a promising option for continued scaling of the manufacture of SOI CMOS devices to smaller and smaller dimensions. It has the advantage of sharper sub-threshold slope, high mobility (since the devices are operated at a lower effective field), low junction capacitance, elimination of CMOS latch-up, and better short-channel effect control. The disadvantage of such devices is that the series resistance increases as the SOI film is thinned. One solution to the series resistance problem is the use of an elevated source drain that may be created by selective epitaxial Si growth.

In some prior art thin Si channel devices, extensions are implanted prior to RSD formation. This causes at least two problems. A first problem is that since that a PMOS FET extension requires a fairly thick offset spacer, a high resistance region exists under the spacer. The second problem is that since extension implants are performed prior to the RSD process, the dopants are subjected to the significant thermal budget of the RSD process. This can cause unwanted diffusion of the dopants. In addition, the incubation time is different for P type silicon and N type silicon which leads to substantially different RSD thickness for PMOS FET and NMOS FET devices. Also, the surface concentration of the dopants must be uniform across the wafer as well as from wafer to wafer, which is a major challenge, if the RSD process is to be manufacturable.

In another prior art thin silicon (Si) channel device, a disposable spacer process is used. A wide disposable spacer is used to grow the RSD. Next, deep source and drain implants are performed. Then the spacer is removed, and the extensions are implanted. Although the disposable spacer scheme overcomes the problem of subjecting the extensions to the RSD thermal budget, that process does not overcome the problem of the high resistance region outside the RSD layer. Based upon the above remarks, it is clear that a need exists for a way to overcome the high resistance problem as well as the thermal budget problem.

U.S. Pat. No. 6,465,311 of Shenoy entitled "Method of Making a MOSFET Structure Having Improved Source/Drain Junction Performance" describes a MOSFET structure including a gate stack formed over a gate oxide above an active region of a substrate. With a pair of shallow trenches defined on either side of the gate stack, an intrinsic silicon material is disposed within the pair of shallow trenches up to a top surface of the gate stack. The MOSFET structure includes source and drain implanted impurities that are defined in an upper portion of the intrinsic silicon material. The upper portion is configured to extend down into the intrinsic silicon material to a target diffusion level that is just below the gate oxide of the gate stack.

U.S. Pat. No. 6,391,720 of Sneelal et al. entitled "Process Flow For A Performance Enhanced MOSFET with Self-Aligned, Recessed Channel" describes forming a selfrecessed channel, MOSFET. A patterned mask oxide layer is formed over a substrate with an active area encompassed by a shallow trench isolation (STI) region. Then the surface and a portion of the STI region are etched. Next the mask oxide layer is removed. In the unmasked area a gate recess is created. Then a thin pad oxide layer is grown on the surface and a thick silicon nitride layer is formed covering the surface and filling the gate recess. Top surface planarization exposes the pad oxide layer. Growth of an additional oxide layer thickens the pad oxide layer. A portion of the silicon nitride layer is etched away. An additional oxide layer is grown further thickening the pad oxide layer to form a tapered oxide layer along the sidewalls of the gate recess. Then the remaining silicon nitride layer is removed, rethe gate recess. A threshold adjust and punchimplantation is performed into the substrate below the gate recess. Then isotropic etching of the pad oxide removes the oxide layer at the bottom of the gate recess. A gate dielectric layer is grown in the bottom of the gate recess. Then gate polysilicon is deposited over the top surface, filling the gate recess. The top surface is replanarized to expose the substrate. Then a screen oxide layer is deposited, followed by light and heavy S/D implantations and annealing. Metallization and passivation complete the fabrication of the MOS transistor device.

U.S. Pat. No. 6,225,173 of Yu entitled "Recessed Channel Structure For Manufacturing Shallow Source/Drain Extensions" describes a method of fabricating integrated circuit CMOS FET devices with ultrasource and drain junctions utilizing a damascene process. The substrate is overto form extensions in the source and drain regions.

U.S. Pat. No. 5,814,544 of Huang entitled "Forming a MOS Transistor with A Recessed Channel" describes fabrication of a MOS transistor by forming an inverse gate mask consisting of a lower silicon dioxide layer and an upper silicon nitride layer. The exposed channel region is thermally oxidized. The mask is removed to permit a source/drain implant. The thermal oxide is removed so that the channel region is recessed. A differential oxide growth then serves to mask the source and the drain for channel threshold adjust and punchimplants. A doped polysilicon gate is formed, with the thinner area of the differential oxide serving as the gate oxide. In the resulting structure, the punchthrough dopant is spaced from the source and the drain, reducing parasitic capacitance and improving transistor switching speeds.

U.S. Pat. No. 4,616,400 of Macksey et al. entitled "Process for Fabricating A Double Recess Channel Field Effect Transistor" forming a double recess, N+ ledge FET using a single masking step. Two layers of photoresist of differing types are formed on the surface of an N+ epitaxial layer. A layer of material that may be etched by RIE with Freon®, but will not etch by RIE with oxygen, is formed over the photoresist layers. A gate pattern is etched into this surface layer of material and the photoresist layers are selectively undercut to provide a pattern to etch the gate recess and the wide recess. A gate contact is then formed by perpendicular evaporation through the gate pattern in the surface layer of material. A process is provided for forming a selfdouble recess transistor using a single mask to form the gate, the wide recess and the gate recess, and another mask to form the source and drain contacts.

First, we have discovered that there is a problems caused by over-etching the portions of Ultra-Thin (UT) Silicon-On-Insulator (SOI) in CMOS FET devices in close proximity to the spacers during the spacer etching process. Accordingly there is a need to overcome that problem.

In addition, we have discovered that it is difficult to control Raised Source and Drain (RSD) epitaxy, especially on a doped surface. In accordance with this invention, a Si/SiGe/SOI structure can be employed to manufacture UT-SOI CMOS devices.

SUMMARY OF INVENTION

An object of this invention is to provide a manufacturable method and a device structure that overcomes the problems described above.

This invention teaches a controlled manufacturable method of selectively recessing the channel region is such a way that the extension regions remain thick so that no raised source drain process is needed.

In accordance with this invention, a method is provided for manufacturing Ultra-Thin SOI CMOS FET Devices with Raised Sources and Drains (RSD) Using Recessed Channels and Structures Manufactured Thereby.

The method starts with a relatively thick modified SOI structure comprising Silicon/Silicon Germanium/Silicon on an insulator (Si/SiGe/Si-on-insulator), which is thick enough for the spacer etch.

A SiGe layer and a top Si layer are used as etch stoppers to obtain good control of the channel thickness, which is important for the control of Vt, mobility, and the Short Channel Effect (SCE) of UT-SOI devices.

In accordance with this invention a method is provided for forming an RSD FET device with a recessed channel, a raised silicon S/D, and a gate electrode structure on an SOI structure. i.e. a silicon layer formed on a substrate as follows. Form a SiGe layer over the silicon layer and a RSD layer over the SiGe. Etch through the RSD layer and the SiGe to form a gate electrode space reaching down the silicon layer. Form a pair of RSD regions separated by the gate electrode space. Line the walls of the gate electrode space with an internal etch stop layer and an inner sidewall spacers. Form a gate electrode inside the inner sidewall spacers on the silicon layer. Form external sidewall spacers adjacent to the gate electrode between the RSD regions next to the inner sidewall spacers, and dope the RSD regions, whereby a recessed channel is formed in the SOI silicon layer below the SiGe layer, and with the channel located between the raised source/drain regions which are formed above the SiGe layer. Preferably, an etch stop layer is formed on the surface of the raised source drain layer before forming the gate electrode space. Preferably, the steps of forming the gate electrode space include the following steps. Form a dummy gate over the source/drain layer; form a conformal outside spacer layer over the dummy gate; form an exterior masking layer over the outside spacer layer, etching back the exterior masking layer to expose the dummy gate, and remove the dummy gate to form the gate electrode space. Preferably, the exterior masking layer is composed of silicon dioxide that covers the outside spacer layer until after filling the gate electrode space with the gate electrode and planarization thereof. Preferably, the exterior masking layer is composed of silicon germanium (SiGe) which covers the outside spacer layer until after filling the gate electrode space with the gate electrode and planarization thereof and after recessing the outside spacer layer down to the etch stop layer. Preferably, the insulator forming the substrate comprises silicon oxide. Preferably, an etch stop layer is formed on the surface of the raised source drain layer before forming the gate electrode space, and the exterior masking layer is composed of silicon germanium (SiGe) which covers the outside spacer layer until after filling the gate electrode space with the gate electrode and planarization thereof and after recessing the outside spacer layer down to the etch stop layer. Preferably, an etch stop layer is formed on the surface of the raised source drain layer before forming the gate electrode space; the exterior masking layer is composed of silicon germanium (SiGe) which covers the outside spacer layer until after filling the gate electrode space with the gate electrode and planarization thereof. After recessing the outside spacer layer down to the etch stop layer, perform a raised source extension region and a raised drain extension region implant and then form an exterior spacer aside from the gate electrode.

In accordance with another aspect of this invention, a method is provided for forming an FET device with a raised silicon source/drain and a gate electrode structure on an SOI structure comprising an SOI silicon layer formed on a substrate. The substrate comprises an insulator. A, recessed channel is formed in the SOI silicon layer below the SiGe layer with the recessed channel located between the raised source/drain regions which are formed above the SiGe layer. The steps of the method are as follows. Form a SiGe layer over the silicon layer. Form a raised source/drain layer over the SiGe layer. Form an etch stop layer over the raised source/drain layer. Form a dummy gate over the source/drain layer. Form a conformal outside spacer layer over the dummy gate. Form an exterior masking layer over the outside spacer layer. Etch back the exterior masking layer to expose the dummy gate. Remove the dummy gate to form the gate electrode space etching through the raised source/drain layer and the SiGe layer to form a gate electrode space with walls reaching down through the raised source/drain layer and the SiGe layer to the surface of the silicon layer thereby forming a pair of raised source/drain regions separated by the gate electrode space in the source/drain layer. Line the walk of the gate electrode space with an internal etch stop layer and an inner sidewall spacers. Form a gate electrode inside the inner sidewall spacers on a cleaned surface of the silicon layer. Form external sidewall spacers adjacent to the inner sidewall spacers. Dope the source/drain regions.

Preferably, an exterior masking layer is formed composed of silicon dioxide which covers the outside spacer layer until after filling the gate electrode space with the gate electrode and performing planarization of the gate electrode. Then strip the exterior masking layer. Form the exterior masking layer of silicon germanium (SiGe) which covers the outside spacer layer until after filling the gate electrode space with the gate electrode and after planarization of the gate electrode; and then recess the outside spacer layer down to the etch stop layer adjacent to the gate electrode. Preferably, the insulator forming the substrate comprises silicon oxide.

Preferably, the exterior masking layer is composed of silicon germanium (SiGe) which covers the outside spacer layer until after filling the gate electrode space with the gate electrode and planarization thereof and after recessing the outside spacer layer down to the etch stop layer. Then perform an extension implant to form a raised source extension region and a raised drain extension region; and then form an exterior spacer aside from the gate electrode.

The internal etch stopping film is stripped away after forming the recess and before performing the extension implant. Preferably, a halo implant is performed contemporaneously with the extension implant. Preferably, the external sidewall spacers fill the recess.

BRIEF DESCRIPTION OF DRAWINGS

The foregoing and other aspects and advantages of this invention are explained and described below with reference to the accompanying drawings, in which.

DETAILED DESCRIPTION

Start with a relatively thick modified SOI structure comprising Silicon/Silicon Germanium/Silicon on an insulator (Si/SiGe/Si-on-insulator), which is thick enough for the spacer etch.

Use the SiGe layer 16 and the top Si layer 18 as etch stoppers to obtain good control of the channel thickness, which is important for the control of Vt, mobility, and the Short Channel Effect (SCE) of UT-SOI devices.

Figure 1A:
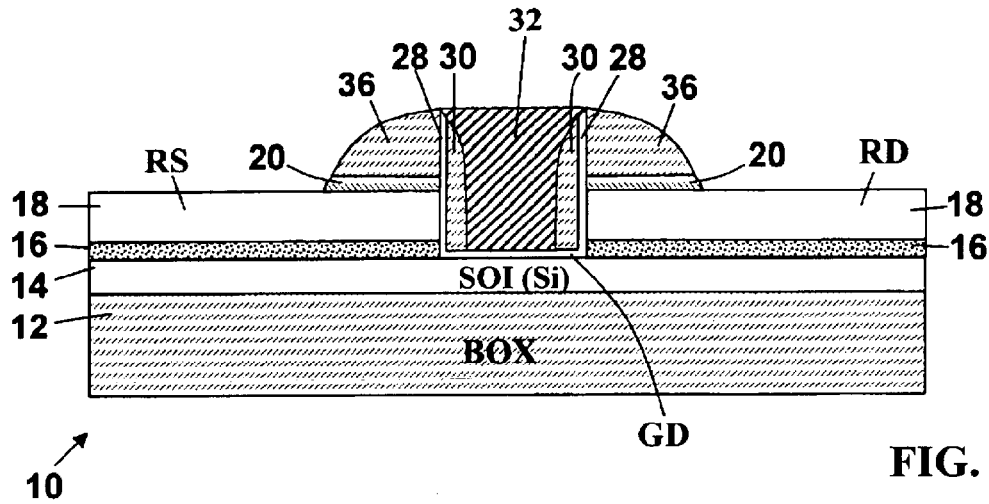
FIGS. 1A–1C show three embodiments of this invention comprising a raised source/drain FET devices formed on an SOI substrate with enhanced protection from damage due to spacer etching.
Figure 1B:
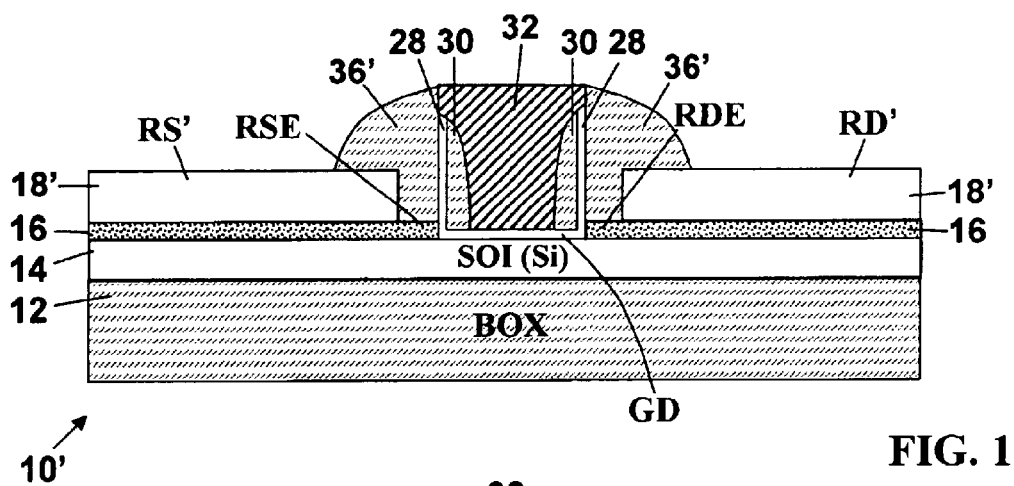
Figure 1C:
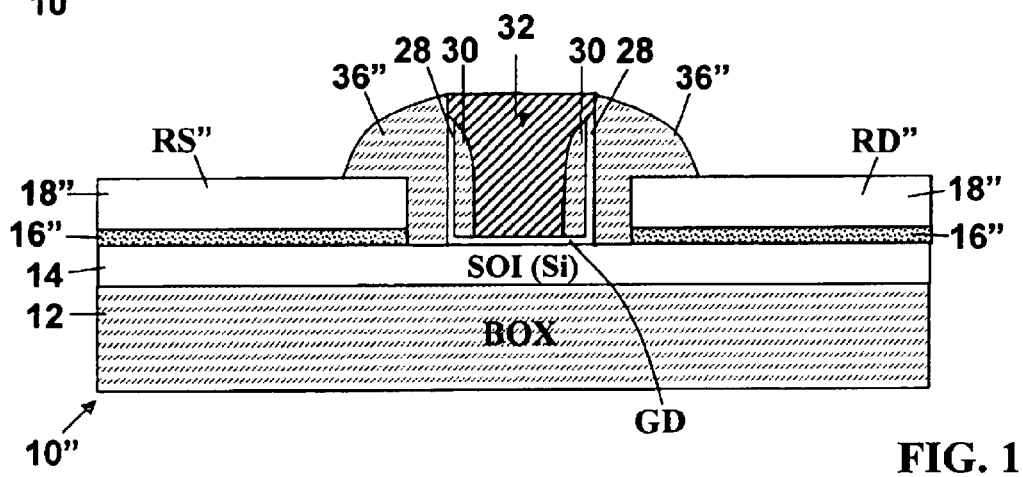

FIGS. 1A–1C show three embodiments of this invention comprising a raised source/drain FET devices formed on an SOI substrate with enhanced protection from damage due to spacer etching.

FIRST EMBODIMENT

FIG. 1A shows a raised source/drain device 10 which is a first embodiment of the present invention. Device 10 is formed on an SOI (Silicon on Oxide) substrate composed of a thick Buried OXide (BOX) layer 12 over which a thin silicon layer 14 has been formed. The silicon layer 14 has been coated (by epitaxial growth of SiGe from SOI) with a thin silicon germanium (SiGe) film 16 and a set of Raised Source/Drain (RSD) regions 18 including a raised source RS and a raised drain RD (hereinafter referred to as RSD regions 18) have been formed over the SiGe film 16 by epitaxial growth of silicon 18 on the SiGe film 16 by epitaxial growth of Si on the SiGe film 16.

In the center of the device 10 an elevated trench (above the silicon layer 14 of the SOI substrate) has been formed down to the surface of the silicon layer 14. The trench has been lined with a thin dielectric layer comprising a gate dielectric layer GD (such as gate oxide) at the base thereof. The sidewalls of the trench have been lined with a thin internal etch stop film 28 preferably silicon oxide above the gate dielectric layer GD. Tapered silicon nitride inner sidewall spacers 30 have been formed on the sidewalls of the thin silicon oxide layer 28 leaving a central opening in the trench opening down to the surface of the gate dielectric layer GD. The trench has been filled with a gate conductor 32 which will serve as the gate electrode of a MOS FET device which is isolated from the silicon layer 14 by the gate dielectric layer GD and which is protected by the tapered dielectric inner sidewall spacers 30 and the internal etch stopping film 28. Above the RSD regions 18 adjacent to the gate conductor, on the outside of the internal etch stopping film 28, a thin dielectric etch stop layer 20 has been formed. The thin dielectric etch stop layer 20 is composed of a material preferably selected from the group consisting of silicon oxide, silicon nitride and oxynitride. External sidewall spacers 36 are formed over the thin dielectric layer 20 outside of the internal etch stopping film 28. The sidewall spacers 36 are composed of a material, preferably selected from the group consisting of silicon oxide, silicon nitride and oxynitride.

The SiGe film 16 and the top Si layer 18 are provided as etch stoppers to obtain good control of the channel thickness, which is important for the control of Vt, mobility, and the Short Channel Effect (SCE) of a device such as the UT-SOI device 10 of FIG. 1A.

SECOND EMBODIMENT

FIG. 1B shows a device 10' which is a second embodiment of the present invention, which is a modification of FIG. 1A. Device a 10' is formed on an SOI (Silicon on Oxide) substrate composed of a thick BOX layer 12 upon which a thin silicon layer 14 has been formed. The silicon layer 14 has been coated (preferably by epitaxial growth of SiGe from Si) with a thin SiGe film 16 and a set of RSD' (RS'/RD') regions 18' have been formed over the SiGe film 16 (preferably by epitaxial growth of Si from SiGe).

However in the case of FIG. 1B, the RSD' regions 18' are separated from the thin silicon oxide internal etch stopping film 28 by the external sidewall spacers 36' composed of a dielectric material preferably selected from the group consisting of silicon nitride, silicon oxide and oxynitride. The external sidewall spacers 36', which cover the RSD' regions 18'D, reach down into contact with the top surface of the SiGe layer 16 between the internal etch stopping film 28 on the inside and the RSD' regions 18' on the outside.

In FIG. 1B, as in FIG. 1A, in the center of the device a 10' an elevated trench (above the silicon layer 14 of the SOI substrate) has been formed down to the surface of the silicon layer 14. The trench has been lined with a thin dielectric layer comprising gate dielectric layer GD at the base thereof plus thin silicon oxide internal etch stopping film 28 lining the sidewalls of the trench above the gate dielectric layer GD. Again tapered silicon nitride inner sidewall spacers 30 have been formed on the sidewalls of the thin silicon oxide layer 28 leaving a central opening in the trench reaching down to the top surface of the gate dielectric layer GD. The trench has been filled with a gate conductor 32 which will serve as the gate electrode of the MOS FET device which is isolated from the silicon layer 14 by the gate dielectric layer GD and which is protected by the tapered dielectric inner sidewall spacers 30 and the internal etch stopping film 28.

In FIG. 1B, the structure of FIG. 1A has been modified so that above the RSD' regions 18' adjacent to the gate conductor 32, on the outside of the internal etch stopping film 28, the external sidewall spacers 36' are formed outside of the internal etch stopping film 28 reaching down below the raised silicon layer 18' to the top of the SiGe film 16. The external sidewall spacers 36' are composed of a material preferably selected from the group consisting of silicon oxide, silicon nitride and oxynitride. The thin dielectric etch stop layer 20 has been omitted from the final product in the embodiment in FIG. 1B.

As in FIG. 1A, the SiGe film 16 and the top Si layer 18' are provided as etch stoppers to obtain good control of the channel thickness, which is important for the control of Vt, mobility, and the Short Channel Effect (SCE) of a device such as the UT-SOI device 10 of FIG. 1A.

THIRD EMBODIMENT

FIG. 1C shows a device 10", that is a third embodiment of the present invention which is a modification of the device 10' of FIG. 1B. As in FIG. 1B, the device 10" of FIG. 1C is formed on an SOI (Silicon on Oxide) substrate composed of a thick BOX layer 12 upon which a thin silicon layer 14 has been formed, and the silicon layer 14 has been coated with a thin SiGe film 16" and the set of RSD" regions RS"/RD" have been formed over the SiGe film 16".

But in FIG. 1C, both the thin SiGe film 16" and the RSD" regions RS"/RD" 18 are separated from the thin silicon oxide internal etch stopping film 28 by the external sidewall spacers 36" composed of silicon nitride or silicon oxide layer, which cover the RSD" regions RS"/RD" and reach down into contact with the top surface of the Si layer 14 (below the SiGe film 16") between the internal etch stopping film 28 on the inside and the RSD" regions RS"/RD" and the SiGe film 16" on the outside.

As in FIGS. 1A and 1B, in the center of the device 10" of FIG. 1C, an elevated opening (such as the opening 22L in FIG. 2H above the silicon layer 14 of the SOI substrate) has been formed down to the surface of the silicon layer 14. The trench has been lined with a thin dielectric layer comprising a gate dielectric layer GD at the base thereof, plus a thin silicon oxide internal etch stopping film 28, and inner sidewall spacer layer 30 (preferably composed of silicon nitride) lining the sidewalls of the trench above the gate dielectric layer GD, providing a narrower opening, such as narrowed opening 22M in FIG. 2I. Again, tapered silicon nitride inner sidewall spacers 30 have been formed on the sidewalls of the thin internal etch stopping film 28, e.g, silicon oxide, leaving a central opening, such as gate electrode opening 22N in FIG. 2J, down to the surface of the gate dielectric layer GD. The trench has been filled with a gate conductor 32 which will serve as the gate electrode of the MOS FET device which is isolated from the silicon layer 14 by the gate dielectric layer GD; and which is protected by the tapered dielectric inner sidewall spacers 30 and the internal etch stopping film 28.

Above the RSD regions 18 adjacent to the gate conductor 32, on the outside of the internal etch stopping film 28, the external sidewall spacers 36" are formed outside of the internal etch stopping film 28 reaching down below the silicon layer 14 and the SiGe film 16" to the top of the Si layer 14. The external sidewall spacers 36" are composed of a material preferably selected from the group consisting of silicon oxide, silicon nitride and oxynitride. Again, the thin etch stop dielectric layer 20 has been omitted from this embodiment.

Again, the SiGe film 16" and the top Si layer 18" are provided as etch stoppers to obtain good control of the channel thickness, which is important for the control of Vt, mobility, and the Short Channel Effect (SCE) of a device such as the UT-SOI device 10 of FIG. 1A.

FOURTH EMBODIMENT

Figure 2A:
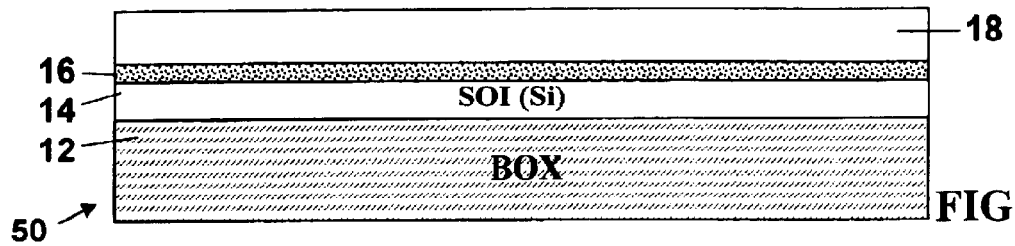
FIGS. 2A–2P show the processing steps for forming an embodiment of an FET device, which is a modification of the FET device of FIG. 1A.
Figure 2B:
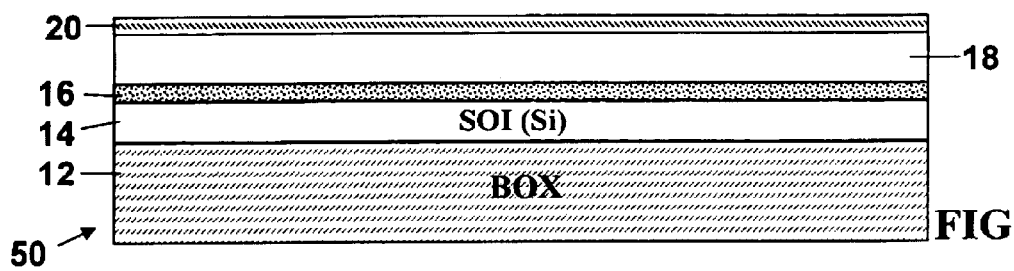
Figure 2C:
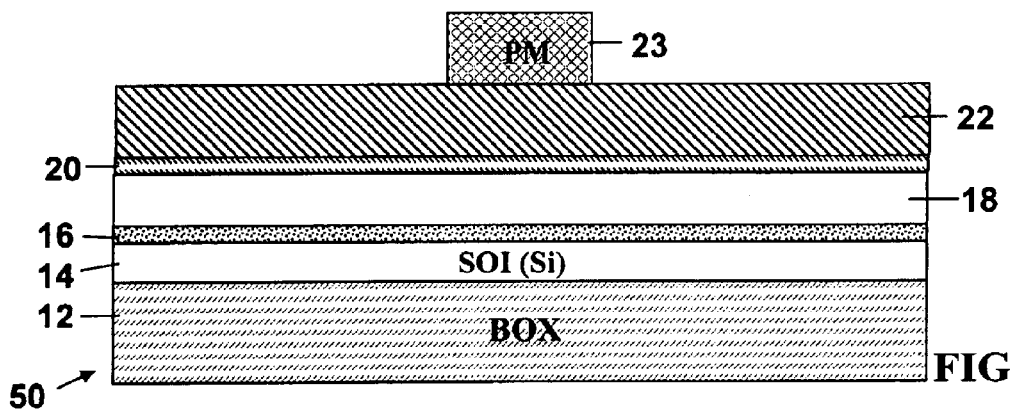
Figure 2D:
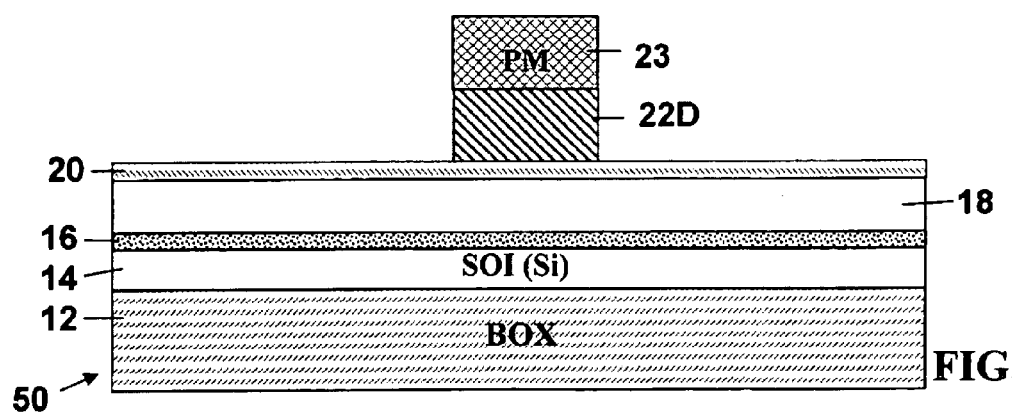
Figure 2E:
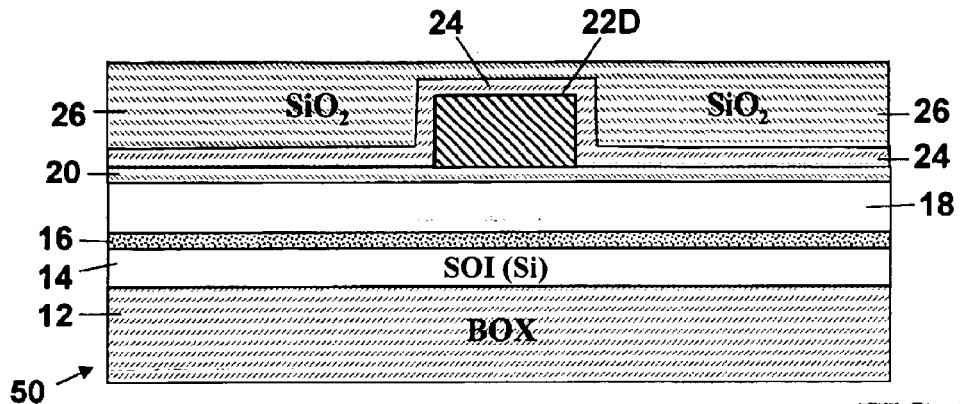
Figure 2F:
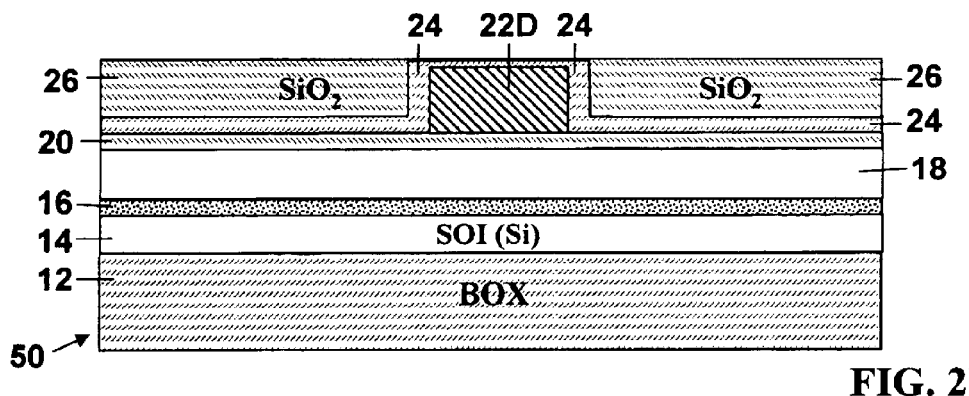
Figure 2G:
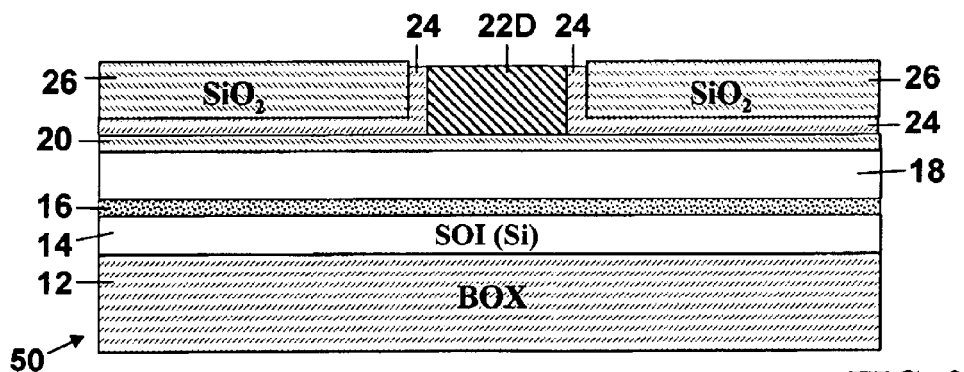
Figure 2H:
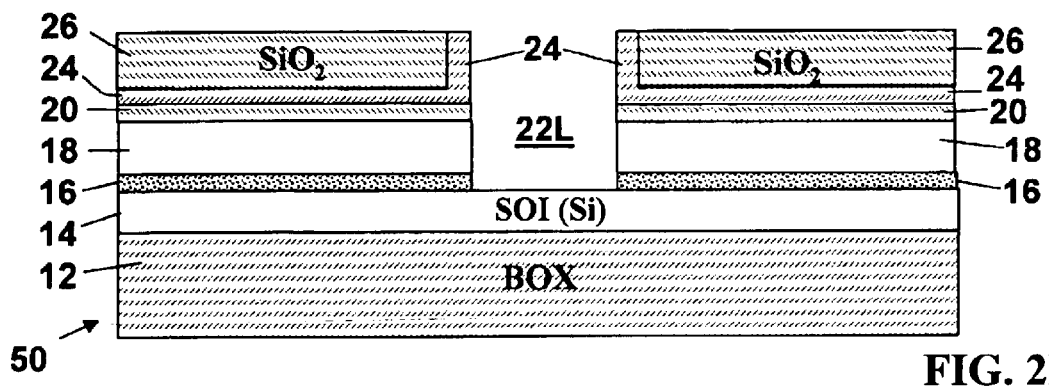
Figure 2I:
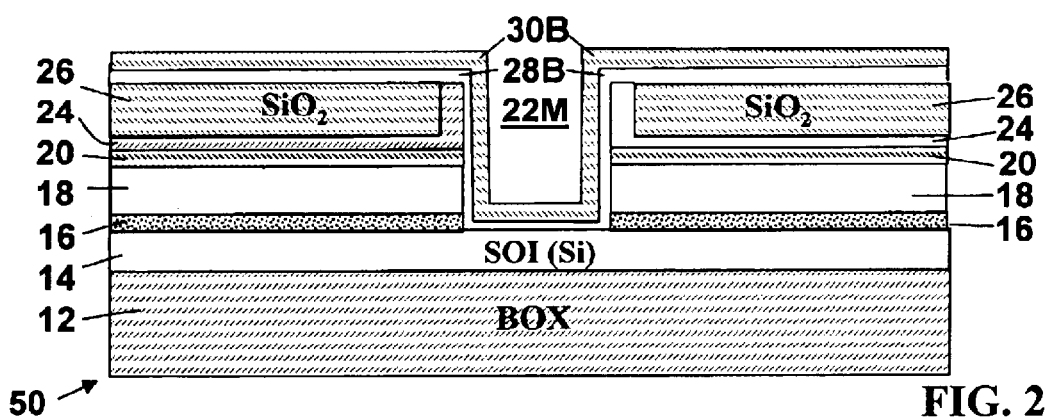
Figure 2J:
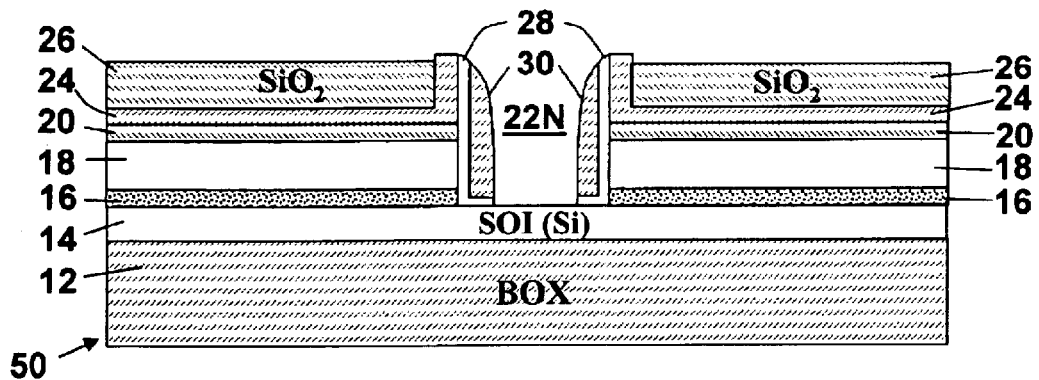
Figure 2K:
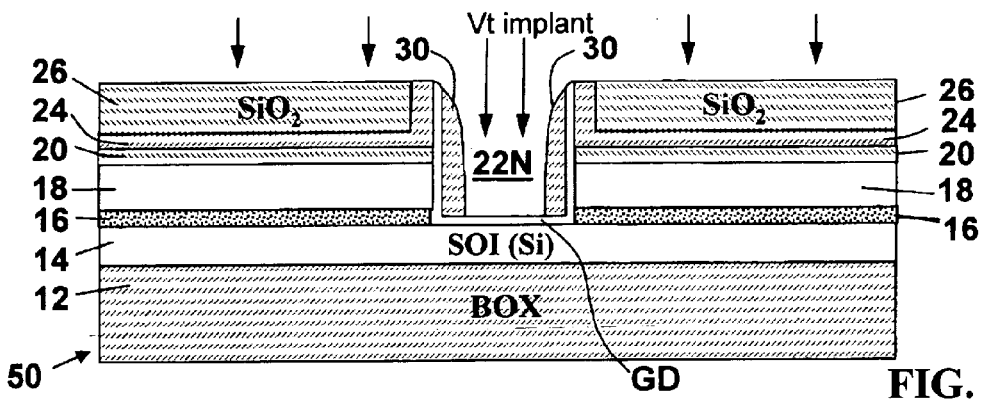
Figure 2L:
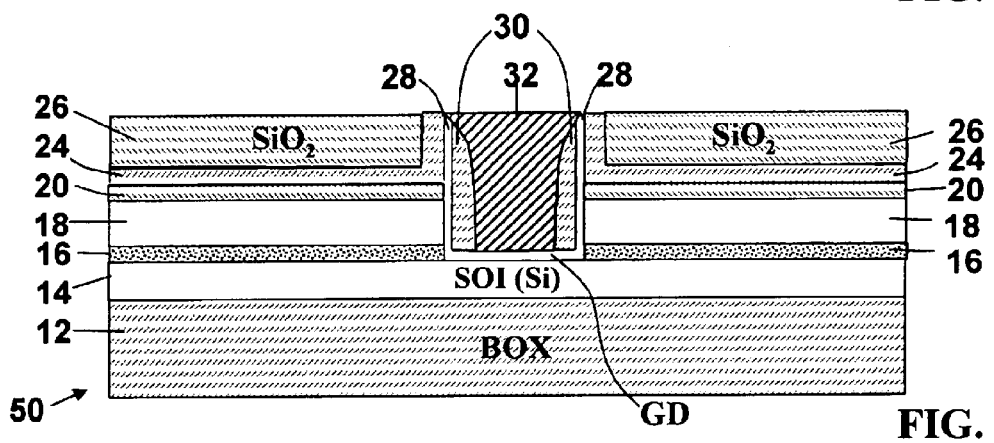
Figure 2M:
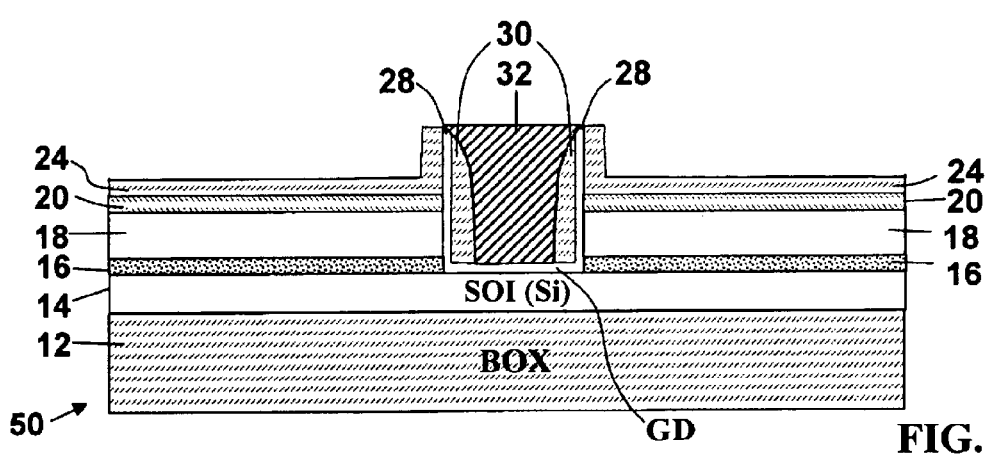
Figure 2N:
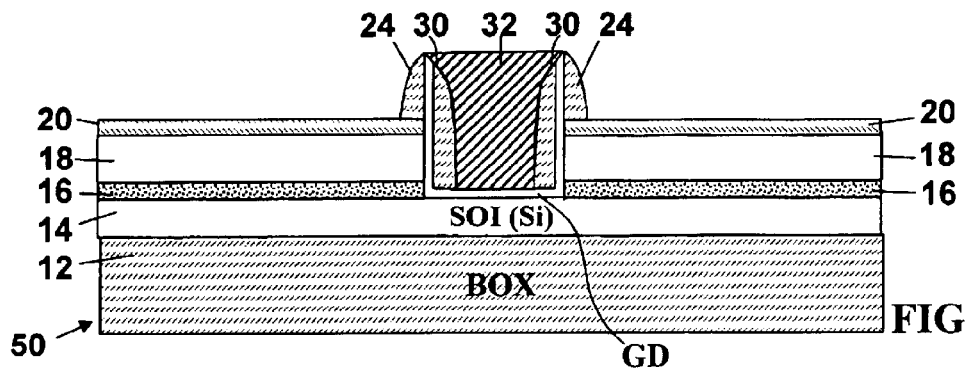
Figure 2O:
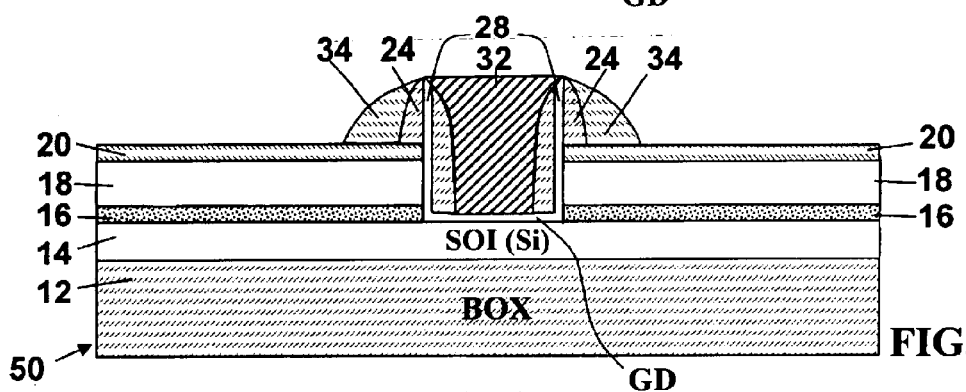
Figure 2P:
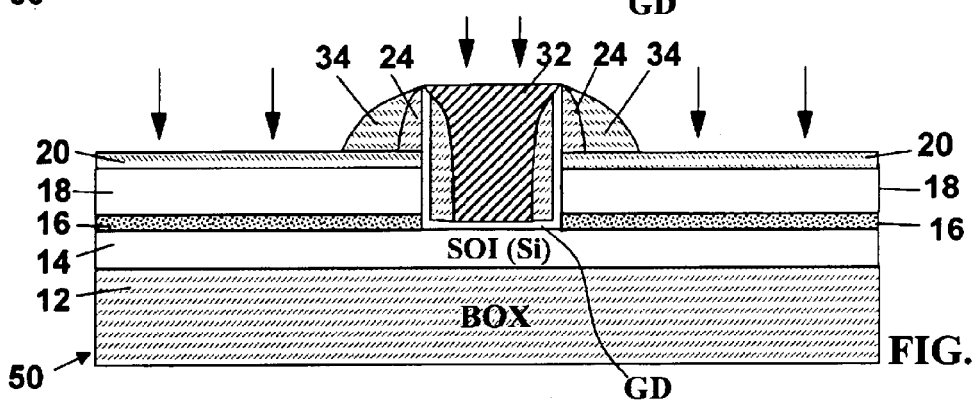

FIGS. 2A–2P show the processing steps for forming an embodiment of an FET device 50 which is a modification of the FET device of FIG. 1A.

FIG. 2A shows an RSD FET device 50 in accordance with this invention in an early stage in the process of the formation thereof. At the start of the process, a substrate is required which is an SOI (Silicon on Oxide) wafer composed of a thick Buried OXide (BOX) layer 12 over which a thin monocrystalline silicon layer 14 has been formed.

Step 1: Forming Monocrystalline SiGe Layer Covering SOI Surface.

Initially, as shown in FIG. 2A a thin, blanket, monocrystalline SiGe layer 16 has been formed over the monocrystalline silicon layer 14 of device 50. The SiGe layer 16 comprises a monocrystalline layer formed by epitaxial growth of silicon germanium (SiGe) alloy (Si with about 10 to 20% of Ge) over the silicon layer 14.

Step 2: Formation of Raised Silicon Layer Over SiGe Layer.

FIG. 2A also shows the device 50 after growth of a thicker, blanket, undoped, monocrystalline, raised silicon (Si) layer 18 by epitaxial deposition onto the surface of the thin SiGe layer 16. The raised Si layer 18 is deposited to be formed into the raised source/drain (RSD) regions 18 later in the process. The raised Si layer 18 is thicker than the SiGe layer 16.

Step 3: Formation of First Etch Stop Layer Over Raised Silicon Layer.

FIG. 2B shows the device 50 of FIG. 2A after deposition of a blanket thin first etch stop layer 20 composed of a material preferably selected from the group consisting of silicon oxide, silicon nitride and oxynitride to be followed by deposition of a blanket dummy (sacrificial) gate layer 22 (shown in FIG. 2C) composed of a thick blanket layer of a material such as polysilicon.

In an alternative embodiment (not shown), the extensions and source drain implants and silicide may be formed in the next step. In this case the use of a high k dielectric and metal gate may be used after removal of the dummy gate 22D, which is shown in FIG. 2D and which is formed in step 5.

Step 4: Formation of Dummy Gate Layer and Dummy Gate Mask.

FIG. 2C shows the device 50 of FIG. 2B after depositing a dummy gate layer 22 and depositing a patterning mask (PM) material formed into a patterning mask 23 over the dummy gate layer 22. The PM patterning mask 23 will be used to pattern the dummy gate layer 22 into a sacrificial structure which can be etched away and filled with the gate electrode structure of an FET. The PM material is composed of a photoresist layer or any other masking material employed in formation of FET devices, as will be well understood by those skilled in the art. The PM material has been formed into a gate patterning mask 23 by conventional masking techniques, as will be well understood by those skilled in the art.

In summary, in step 3 a first etch stop layer 20 has been deposited over the surface of the raised Si layer 18 to serve as an etch stop when the dummy gate layer 22 applied in step 4 is being patterned by etching as shown by FIGS. 2C and 2D. To prepare for patterning a gate electrode opening 22L shown in FIG. 2H, the thick, blanket sacrificial, dummy gate layer 22 has been deposited over the first etch stop layer 20; and the patterning mask 23 has been formed over the dummy gate layer 22.

In an alternative embodiment (not shown), the extensions and source drain implants and silicide may be formed in the next step. In this case the use of a high k dielectric and metal gate may be used after removal of the dummy gate 22.

Step 5: Patterning of Dummy Gate by Etching in Pattern of Mask.

FIG. 2D shows the device 50 of FIG. 2C after forming the dummy gate 22D by etching away exposed portions of the dummy gate layer 22 aside from the gate patterning mask 23 down to the first etch stop layer 20, using conventional etch stop detection techniques. The dummy gate 22D provides a form adapted for creating a hollow or trench referred to hereinafter as a gate electrode opening 22L seen in FIG. 2G.

Step 6: Deposit Conformal Exterior Spacer Layer.

FIG. 2E shows the device 50 of FIG. 2D after stripping the patterning mask 23 and then depositing a thin, conformal, outside spacer film 24 (composed of a material such as silicon nitride) covering both the dummy gate 22D and the first etch stop layer 20.

Step 7: Deposit Blanket Exterior Masking Layer.

Next as shown in FIG. 2E, blanket deposition is performed creating an exterior masking layer 26 (e.g. silicon dioxide) for protecting the conformal outside spacer film 24, covering the dummy gate 22D and the outside spacer film 24.

Step 8: Planarize Exterior Masking Layer.

FIG. 2F shows the device 50 of FIG. 2E after performing a CMP (Chemical Mechanical Planarization) step etching away a portion of exterior masking layer 26 to expose the conformal outside spacer film 24, stopping the CMP process with a thin film of the outside spacer film 24 remaining, covering the dummy gate 22D. This step leaves the remaining portion of the dummy-gate exterior masking layer 26 (e.g. silicon dioxide) planarized and intact.

Step 9: Etch Exterior Spacer Film to Expose Top of Dummy Gate.

FIG. 2G shows the device 50 of FIG. 2F after performing a step of etching away enough of the outside spacer film 24 to expose the top of the dummy gate 22D.

Step 10: Remove Dummy Gate.

FIG. 2H shows the device 50 of FIG. 2G after removal of the dummy gate 22D (preferably by etching it away) to form a shallow portion of the opening for trench 22L. Then the opening which is being formed as trench 22L is deepened by the following step of anisotropically etching away the exposed portions of first etch stop layer 20, as well as the RSD layer 18 and the SiGe film 16 down to the surface of the thin silicon film 14. The etching yields a high quality planar Si surface. This method can be also used to produce stress in the channel due to relaxation of stress in the strained SiGe film 16, and to produce compressive stress in the channel of the device. Compressive stress can enhance PMOS FET performance.

Step 11: Deposit Conformal Internal Etch Stop Film and Conformal Inner Spacer Film.

FIG. 2I shows the device 50 of FIG. 2H after an internal etch stopping film 28B is deposited conformally, which is preferably composed of thin silicon oxide ($SiO_2$), to serve as an etch stopper for the internal spacer film 30B. Next, as also shown by FIG. 2I, the internal spacer film 30B (preferably composed of silicon nitride) is deposited conformally over the internal etch stop film 28B, narrowing the opening forming trench 22L leaving a narrower and shallower opening 22M.

Step 12: Etch Back Inner Spacer/Internal Etch Stop Films.

FIG. 2J shows the device 50 of FIG. 2I after anisotropic dry etching to form the inner sidewall spacers 30 and the internal etch stop film 28 by etching of the internal spacer film 30B and the internal etch stop film 28B, exposing the surface of the silicon layer 14 at the bottom of the opening 22M and exposing the top of the exterior masking layer 26 aside from the opening 22M and forming an enlarged gate electrode opening 22N that has been formed in the process of formation of the inner sidewall spacers 30 and re-exposing the silicon layer 14.

Step 13: Cleaning Exposed Silicon; Forming Gate Dielectric Layer; and Vt Implant.

FIG. 2K shows the device 50 of FIG. 2J after cleaning the exposed silicon 14, for the gate area followed by the next step of forming a gate dielectric layer GD (e.g. a gate oxide GOX layer or deposit a high K material as the gate dielectric layer) at the base of the opening 22N. Then perform a Vt implant (if needed) through the gate electrode opening 22N into the silicon layer 14 is performed, as indicated by the arrows in the drawing. A blanket Vt implant is employed, which reaches everywhere that the surfaces are exposed.

Step 14: Deposition of Gate Electrode Layer.

FIG. 2L shows the device 50 of FIG. 2K after deposition of a gate electrode layer 32 overfilling the gate electrode opening 22N covering the tops of sacrificial outside spacer film 24 and the exterior masking layer 26 followed by partial removal of gate electrode layer 32. The gate electrode layer 32 can be composed of polysilicon or a conventional metal gate material such as tungsten (W). The deposit of the gate electrode layer 32 is excessive and must be partially removed by a subtractive process such as CMP stopping on the top of the dummy-gate-exterior masking layer 26 (e.g. $SiO_2$). Alternatively, gate electrode layer 32 can be etched back.

Step 15: Stripping Away Exterior Masking Layer.

FIG. 2M shows the device 50 of FIG. 2L after stripping away the Exterior Masking Layer 26 exposing the outside spacer film 24, which in the case that layer 26 is silicon oxide comprises a conventional process.

Step 16: Etching Exterior Spacer Film to Form Initial Exterior Spacers.

FIG. 2N shows the device 50 of FIG. 2M after the outside spacer film 24 has been etched back using a conventional process such as reactive-ion plasma etching (RIE) or dry etching to form outside spacers 24 immediately adjacent to the gate electrode 32, the internal spacers 30 and the internal etch stop film 28. This leaves the top surface of dielectric etch stop layer 20 exposed aside from the outside spacers 24.

Step 17: Formation of Wide Exterior Spacers for Source/Drain (S/D) Ion Implantation.

FIG. 2O shows the device 50 of FIG. 2N after formation of wide source/drain exterior spacers 34 (preferably composed of silicon nitride) juxtaposed with outside spacer 24 to separate the S/D ion implantation from the gate electrode 32.

Step 18: S/D Ion Implantation.

FIG. 2P shows the device 50 of FIG. 2O during S/D ion-implantation as indicated by the arrows. After the implantation a final annealing (preferably rapid thermal annealing, spike annealing, or no-melt laser annealing) and metallization steps are performed as will be well understood by those skilled in the art to finish the MOSFET device 50. The recessed channel is located below the gate 32 is the SOI silicon 14 between the spacers 34.

FIFTH EMBODIMENT

Figure 3A:
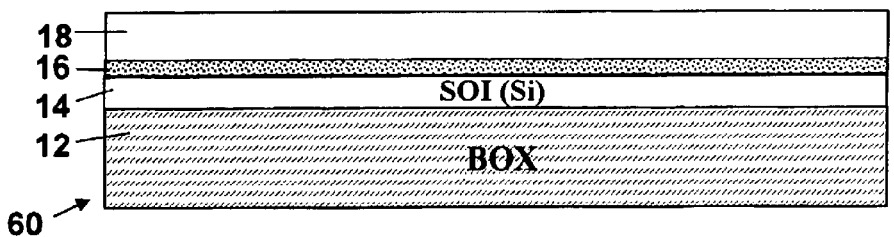
FIGS. 3A–3W show the processing steps for forming an embodiment of an FET device, which is a modification of the FET device of FIG. 1C.
Figure 3B:
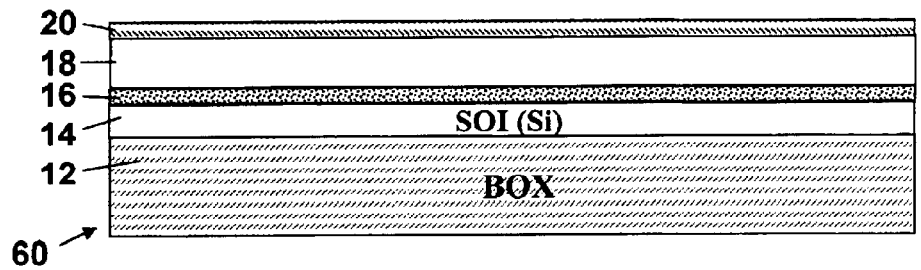
Figure 3C:
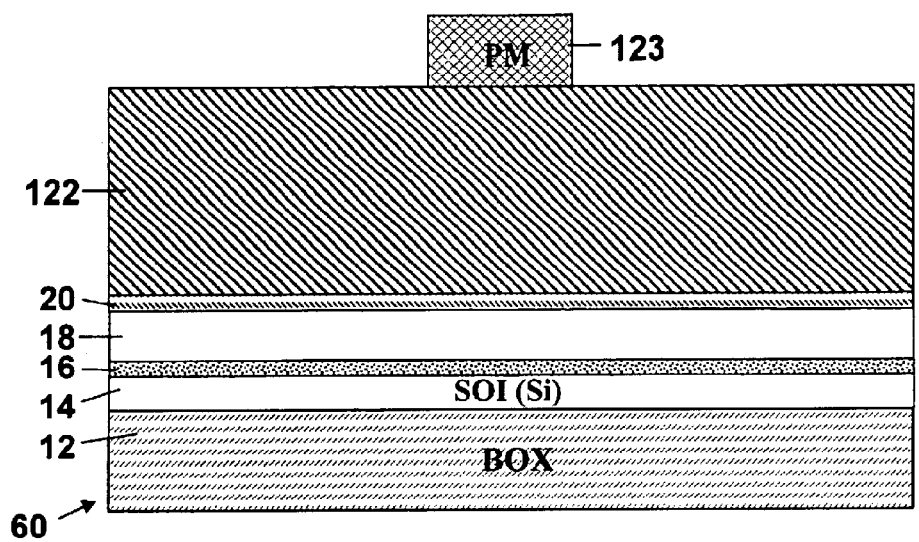
Figure 3D:
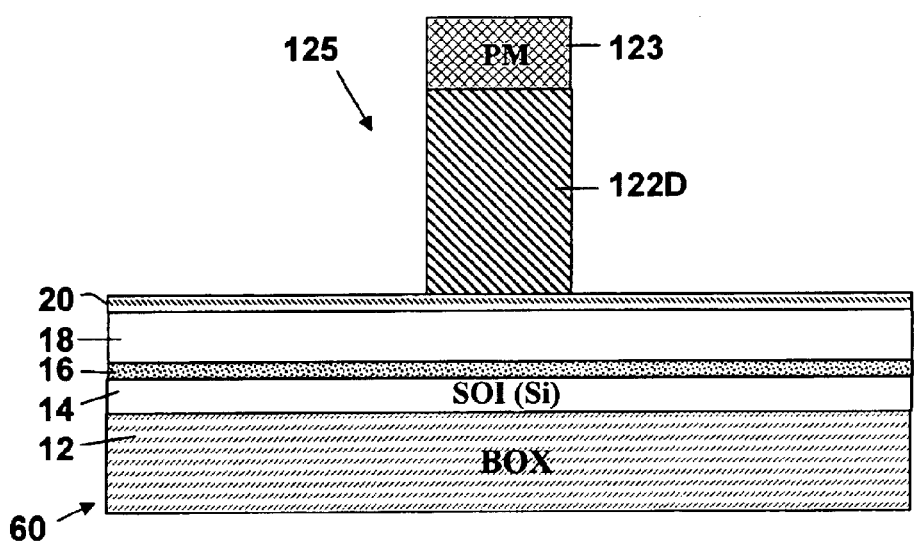
Figure 3E:
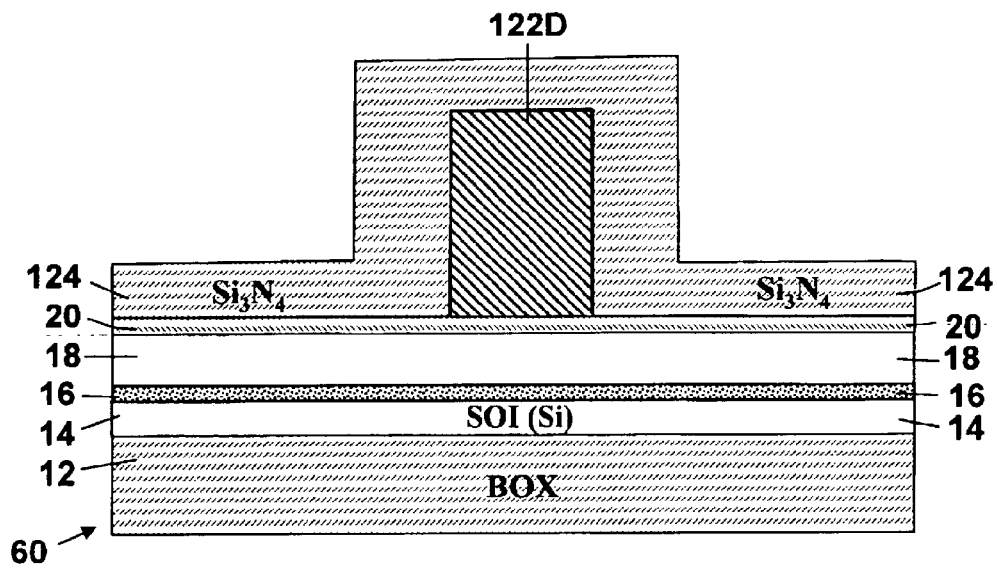
Figure 3F:
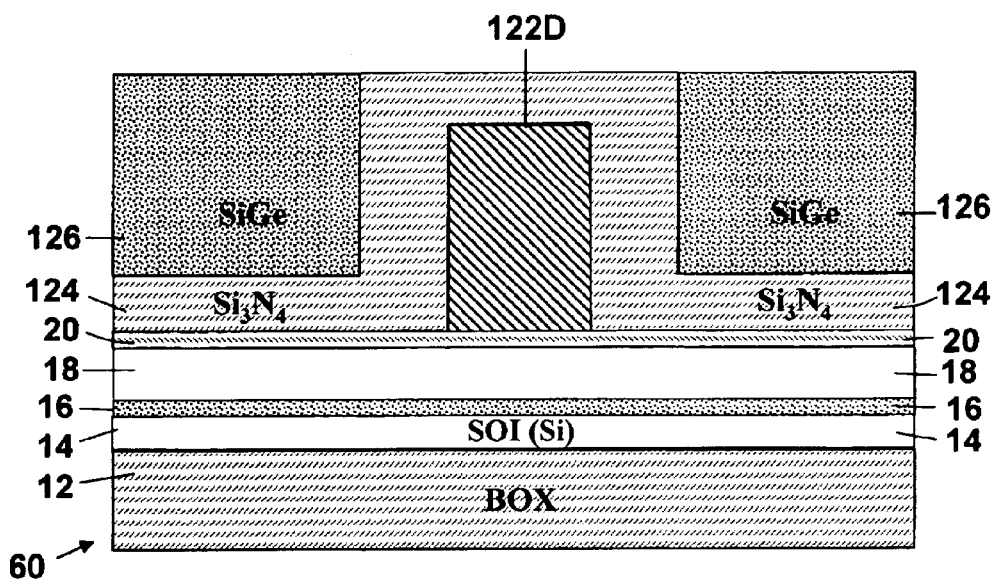
Figure 3G:
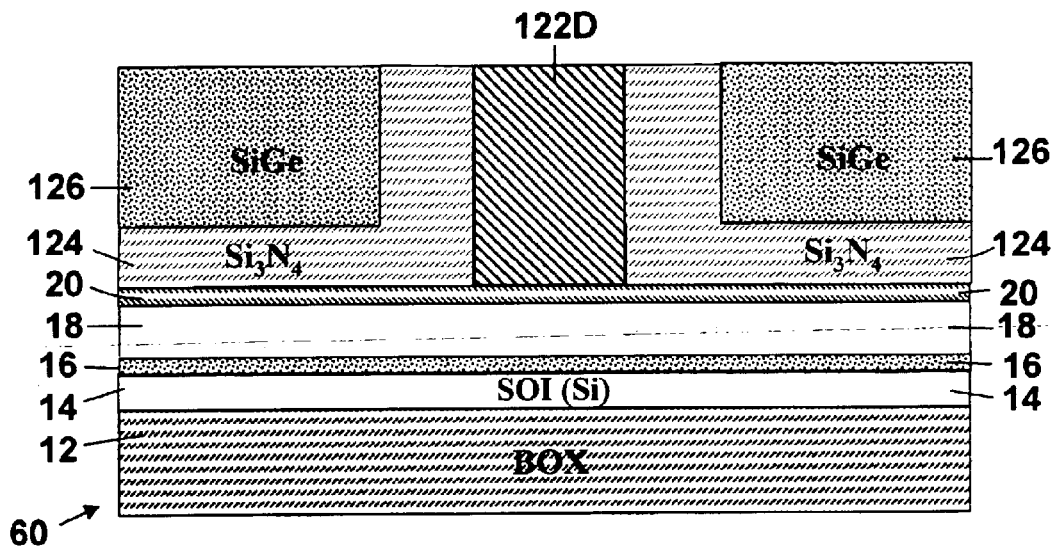
Figure 3H:
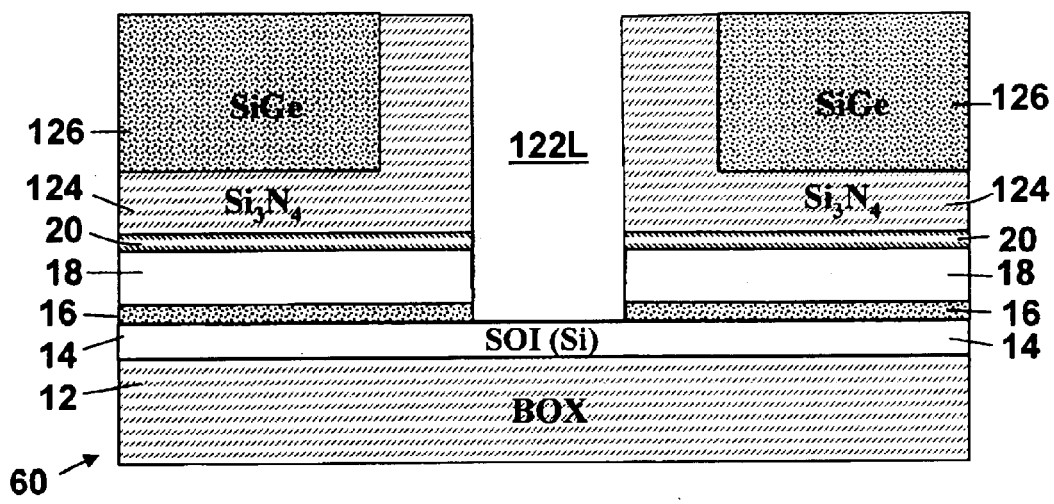
Figure 3I:
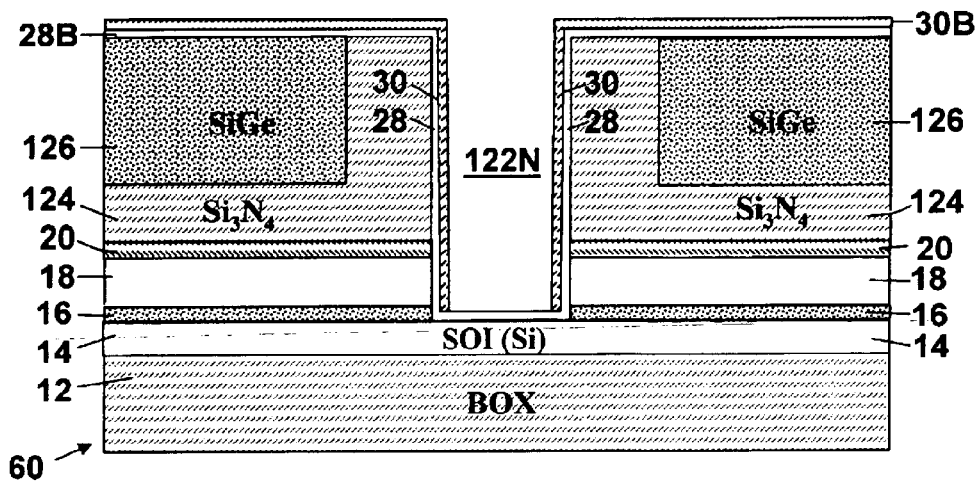
Figure 3J:
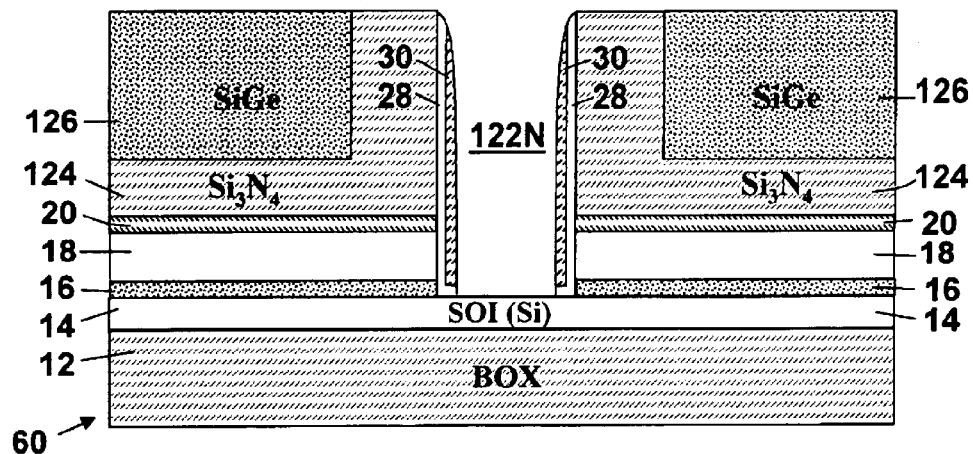
Figure 3K:
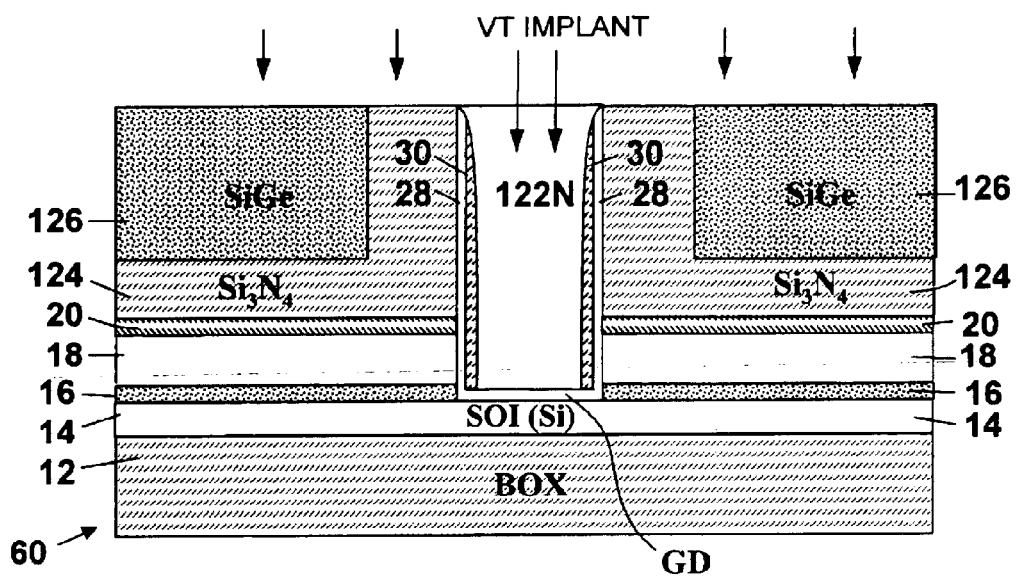
Figure 3L:
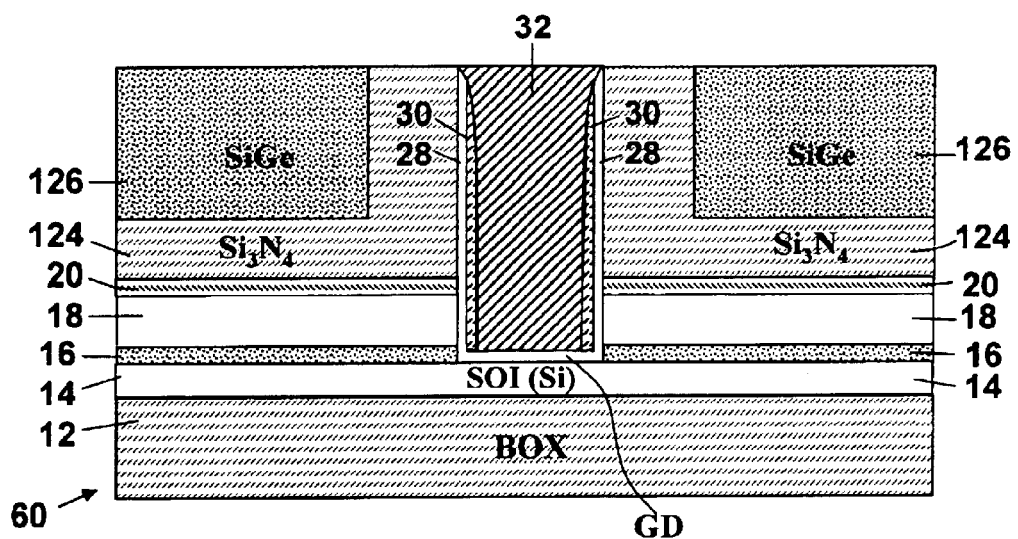
Figure 3M:
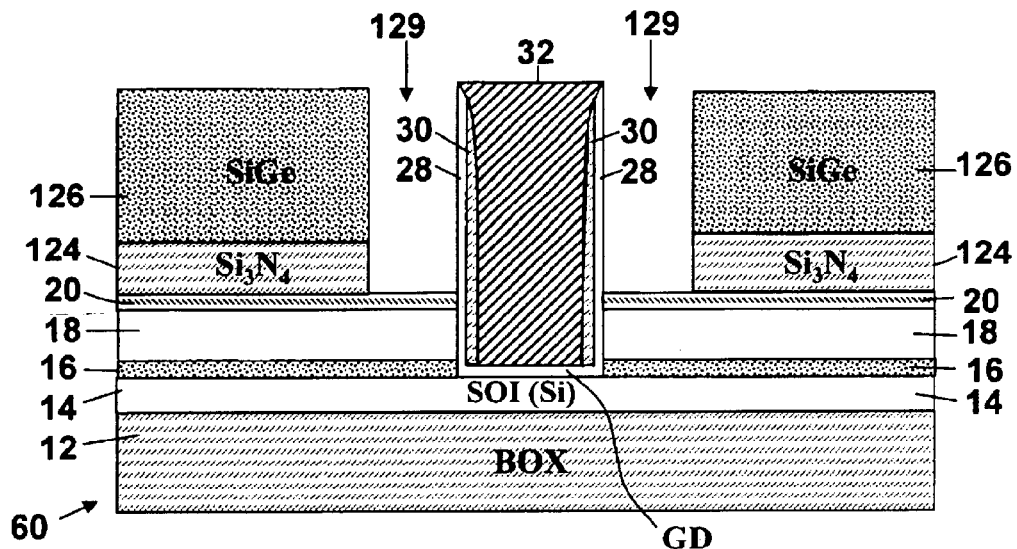
Figure 3N:
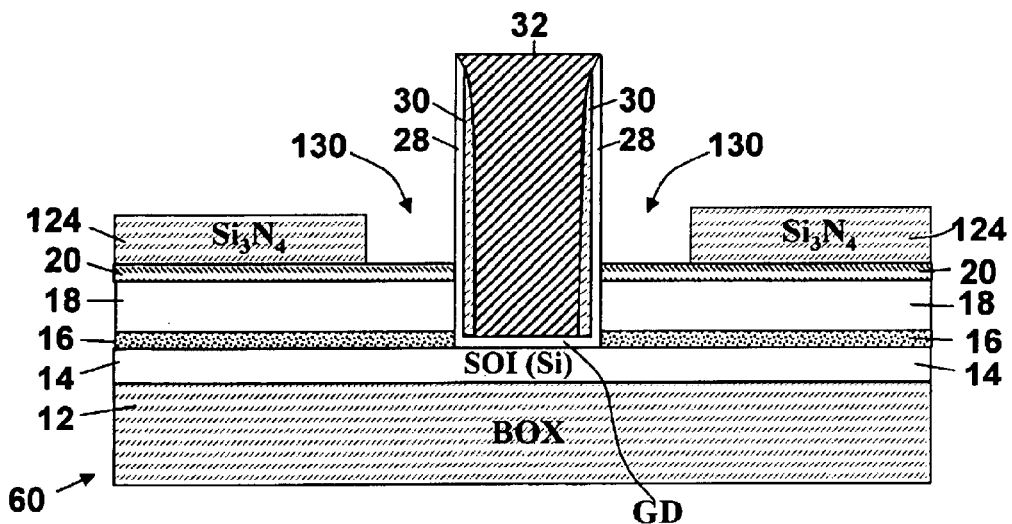
Figure 3O:
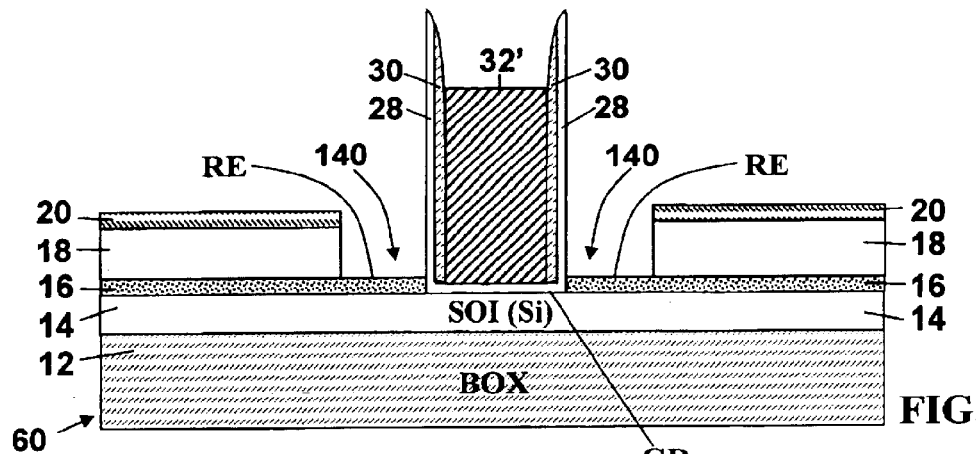
Figure 3P:
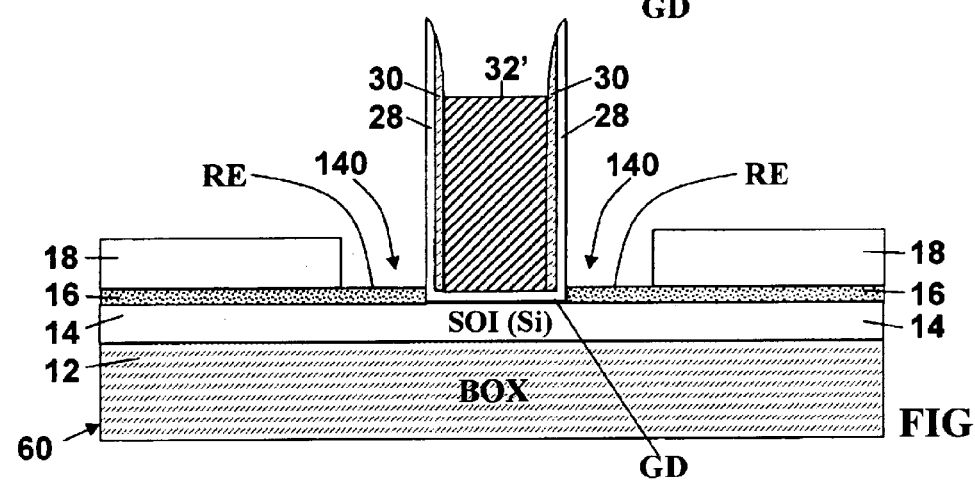
Figure 3Q:
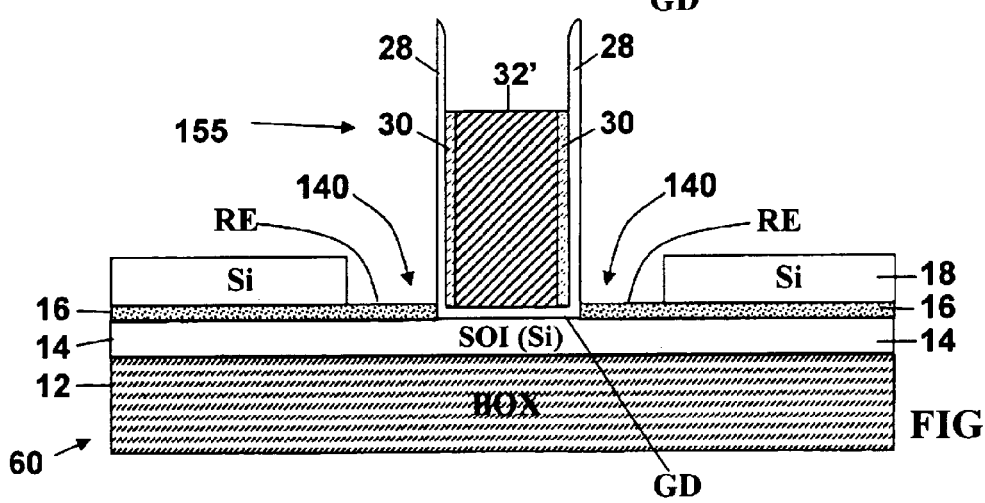
Figure 3R:
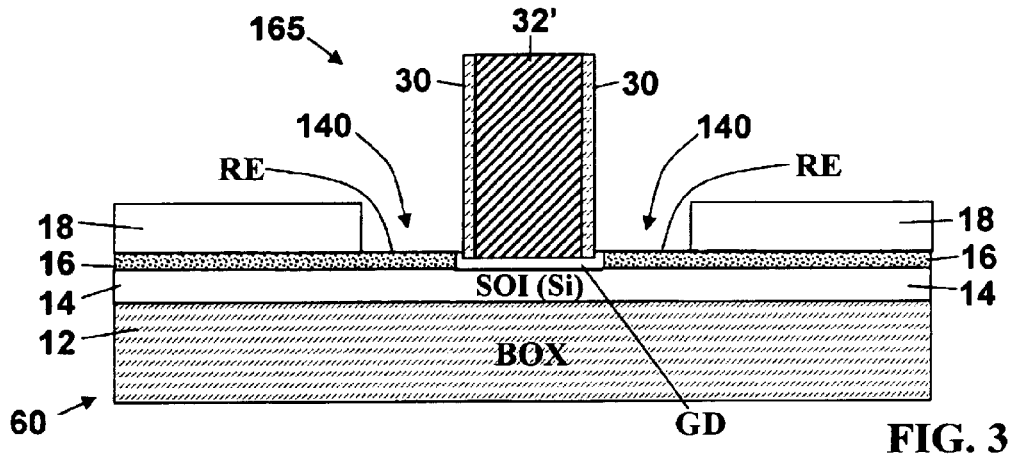
Figure 3S:
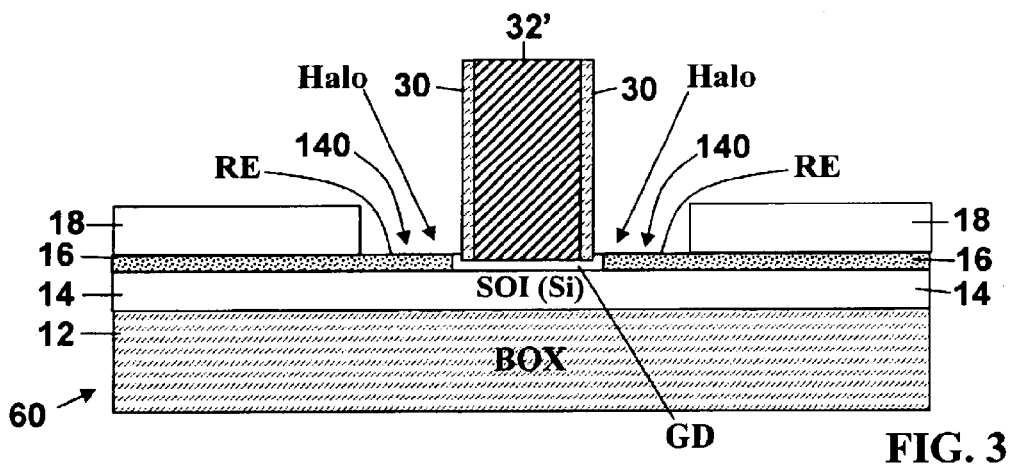
Figure 3T:
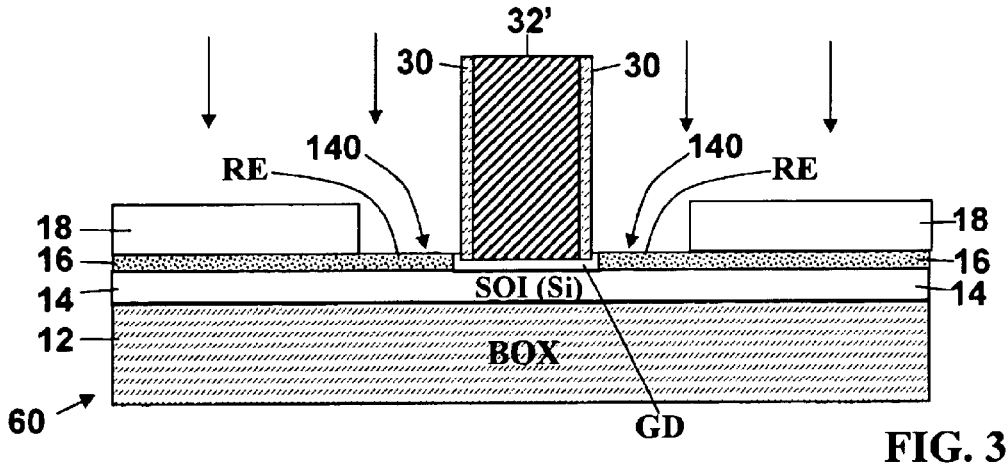

FIGS. 3A–3T show processing steps for forming an RSD FET device 60 that is a modification of the device of FIG. 1C. In this embodiment of the invention, formation of a structure by ion implantation is performed more easily. This method is similar to a process of formation of an RSD with a disposable spacer. In this process, a deposit is made of a thick exterior masking layer 126 composed of SiGe as shown in FIG. 3F in Step 7 instead of exterior masking layer 26 (silicon dioxide) in the fourth embodiment. The exterior masking layer 126 is about 30 nm thick. FIG. 3A shows a device 60 in an early stage in the process of the formation thereof.

As in the case of FIG. 2A, at the start of the process of the fifth embodiment, a substrate is required which is an SOI (Silicon on Oxide) wafer composed of a thick Buried OXide (BOX) layer 12 over which a thin monocrystalline silicon layer 14 has been formed.

Step 1: Forming Monocrystalline SiGe Layer Covering SOI Surface.

FIG. 3A shows the device 50 after the initial step of forming a thin, blanket, monocrystalline SiGe layer 16 over the monocrystalline silicon layer 14 of device 50. The SiGe layer 16 comprises a monocrystalline layer formed by epitaxial growth of silicon germanium (SiGe) alloy (Si with about 10 to 20% of Ge) over the silicon layer 14.

Step 2: Formation of Raised Silicon Layer Over SiGe Layer.

FIG. 3A also shows the device 50 after the next step of formation of a blanket, mono-crystalline raised Si layer 18 over SiGe layer 16. The Si layer 18 is formed by epitaxial growth of a monocrystalline layer 18 of silicon (Si) over thin SiGe layer 16. The silicon layer 18 is thicker than SiGe layer 16.

In another alternative embodiment, the extensions and source drain implants and silicide may be formed in the next step. In this case the use of a high k dielectric and metal gate may be used.

Step 3: Formation of First Etch Stop Layer Over Raised Silicon Layer.

FIG. 3B shows the device 60 of FIG. 3A after deposition of a blanket thin first etch stop layer 20 over the raised silicon layer 18. The etch stop layer 20 is composed of a material preferably selected from the group consisting of silicon oxide, silicon nitride and oxynitride.

Step 4: Formation of Dummy Gate Layer and Dummy Gate Mask.

FIG. 3C shows the device 60 of FIG. 3B after deposition of a blanket dummy (sacrificial) gate layer 122 composed of a thick blanket layer of a material such as polysilicon. Next follows the beginning of a gate trench patterning function starting by depositing a masking material 123 over the dummy gate layer 122. The masking material 123 is composed of a photoresist layer or any other masking material employed in formation of FET devices, as will be well understood by those skilled in the art, has been deposited over the dummy gate layer 122 for patterning the dummy gate layer 122. The masking material 123 has been formed into a gate patterning mask 123 by conventional masking techniques, as will be well understood by those skilled in the art. FIG. 3C also shows the device 60 after formation of a gate patterning mask 123 formed of gate patterning material (PM) over the dummy gate layer 122. The PM material is composed of photoresist layer or any other masking material employed in formation of FET devices, as will be well understood by those skilled in the art, has been deposited over the dummy gate layer 22 for patterning the dummy gate layer 122. The patterning mask 123 has been patterned into a gate patterning mask 123 by conventional masking techniques, as will be well understood by those skilled in the art.

Step 5: Patterning of Dummy Gate by Etching in Pattern of Mask

FIG. 3D shows the device 60 of FIG. 3C after forming the dummy gate 122D by etching away exposed portions of the dummy gate layer 122 aside from gate patterning mask 123 down to the first etch stop layer 20, using conventional etch stop detection techniques.

The dummy gate 122D is patterned to provide a form adapted for creating a hollow or trench referred to hereinafter as a gate electrode opening 122N seen in FIG. 3G.

Step 6: Deposit Conformal Sacrificial Outside Spacer Layer.

FIG. 3E shows the device 60 of FIG. 3D after stripping the patterning mask 123 and then depositing a thin (~30 nm thick), conformal, sacrificial outside spacer layer 124 (composed of a material such as silicon nitride) over both dummy gate 122D and first etch stop layer 20.

Step 7: Deposit Blanket Exterior Masking Layer.

Next in FIG. 3F the device 60 of FIG. 3E is shown after a blanket deposition was performed creating an exterior masking layer 126 of a material such as SiGe which has a different composition from the internal etch stop film 28 (See FIG. 3I and steps 10/11 below) for protecting the conformal, sacrificial, outside spacer layer 124, covering the dummy gate 122D and the sacrificial outside spacer layer 124. While exterior masking layer 126 is indicated to be SiGe, as in the fourth embodiment, it can be silicon oxide, but SiGe has the advantage that it can be etched selectively without damaging the silicon oxide of the internal etch stop film 28 on the sidewall spacer structure seen in FIG. 3J–3L where the sidewall spacer structure would be exposed to several sequences of etching not employed in the same way in the fourth embodiment. This will be explained in more detail below.

Step 8: Planarize Exterior Masking Layer

FIG. 3G shows the device 60 of FIG. 3F after performing a CMP (Chemical Mechanical Planarization) step etching away a portion of exterior masking layer 126 to expose the sacrificial outside spacer layer 124, stopping the CMP process after exposure of the top surface of the dummy gate 122D. This step leaves the remaining portion of the dummy-gate exterior masking layer 126 (e.g. silicon dioxide) planarized and intact. During this process the etchant removes the silicon nitride of the sacrificial outside spacer layer 124 on the top of poly-Si dummy gate and etches back SiGe (~30 nm).

Step 9: Remove Dummy Gate.

FIG. 3H shows the device 60 of FIG. 3G after removal of the dummy gate 122D (preferably by etching it away) to form a shallow opening 122L (as opening 22L in FIG. 2H, details of which are incorporated herein by reference). Then the opening 122L is deepened by the following step of anisotropic etching away the exposed portions of first etch stop layer 20, as well as RSD layer 18 and the SiGe film 16 down to the surface of the thin silicon film 14. The etching yields a high quality planar Si surface. This method can be also used to produce stress in the channel due to relaxation of stress in the strained SiGe film 16, and produce compressive stress in the channel of the device. Compressive stress can enhance PMOS FET performance.

Step 10: Form Internal Etch Stop Film and Outside Spacer Film.

FIG. 3I also shows the device 60 of FIG. 3H after an internal etch stop film 28B was deposited conformally covering the walls of the opening 122L (as opening 22L in FIG. 2H) and covering the surface of the exterior masking layer 126. The internal etch stop film 28B is preferably composed of thin silicon oxide ($SiO_2$) to serve as an etch stopper for the sacrificial outside spacer layer 124. Next, as also shown by FIG. 3I, an inner spacer film 30B (preferably composed of silicon nitride) was deposited conformally-over the internal etch stop film 28B narrowing the opening down leaving a narrower and shallower opening 122M.

Step 11: Form Outside Spacer/Internal Etch Stop Films

FIG. 3J also shows the device 60 of FIG. 3I after formation of inner sidewall spacers 30 and internal etch stop film 28 by anisotropic dry etching of the outside spacer film 30B and the internal etch stop film 28, exposing the surface of the silicon layer 14 at the bottom of the opening 122M in FIG. 3I and removing the layers 28B/30B from the surface of device 60 to re-expose the top of the exterior masking layer 126 aside from the opening 122M and forming an enlarged gate electrode opening 122N that has been formed in the process of formation of the inner sidewall spacers 30 and re-exposing the silicon layer 14.

Step 12: Cleaning Exposed Silicon; Forming Gate Dielectric Layer; and Vt Implant.

FIG. 3K shows the device 50 of FIG. 3J after cleaning the exposed silicon 14, for the gate area followed by the next step of forming a gate dielectric layer GD (e.g. a gate oxide layer or deposit a high K material as the gate dielectric layer) at the base of the opening 22N. Then perform a Vt implant (if needed) through the gate electrode opening 22N into the silicon layer 14 is performed, as indicated by the arrows in the drawing. The Vt implant is a blanket implant which reaches everywhere that the surfaces are exposed.

Step 13: Deposition of Gate Electrode Layer.

FIG. 3L shows the device 60 of FIG. 3K after deposition of a gate electrode layer 32 overfilling the gate electrode opening 122N covering the tops of the sacrificial outside spacer layer 124 and the exterior masking layer 126 followed by partial removal of the gate electrode layer 32. The gate electrode layer 32 can be composed of polysilicon or a conventional metal gate material such as tungsten (W). The deposit of the gate electrode layer 32 is excessive and must be partially removed by a subtractive process such as CMP stopping on the top of the exterior masking layer 126 (e.g. SiGe layer 126). Alternatively, the gate electrode layer 32 can be etched back.

Step 14: Form Recess of Sacrificial Exterior Spacer Layer Near Gate

FIG. 3M shows the device 60 of FIG. 3L after recesses 130 have been formed by selective RIE etching on either side of the gate electrode 32 and the inner sidewall spacers 30 and internal etch stop film 28 down to the first etch stop layer 20. The recess 120 has been formed by anisotropically etching back the sacrificial outside spacer layer 124 between the internal etch stop film 28 and the exterior masking layer 126. The recess 130 has been formed by etching back the sacrificial outside spacer layer 124 using the exterior masking layer 126 as the mask with an etchant which is selective to remove the material of the sacrificial outside spacer layer 124 (which may be silicon nitride or the like) while not attacking the exterior masking layer 126 (which may be SiGe or the like.) The etching process can be an anisotropic RIE process selective to removal of exposed silicon nitride of the sacrificial outside spacer layer 124, while not attacking the material (e.g. silicon oxide) of the internal etch stop film 28 and the exterior masking layer 126.

Step 15: Strip Away Exterior Masking Layer.

FIG. 3N shows the device 60 of FIG. 3M after stripping away the exterior masking layer 126, thereby exposing the sacrificial outside spacer layer 124. The method of removing the SiGe layer 126 is a non-hydrogen containing etch gas mixture. The etch may be a plasma etch and continues through the SiGe selective to Si. In this case the poly-Si gate 32 will not be etched. (Here if one were to use silicon oxide as the sacrificial outside spacer layer 124, instead of SiGe in step 6 of the fifth embodiment, the etching of the silicon oxide of the sacrificial outside spacer layer 124 the top of silicon nitride exterior masking layer 126, may attack the internal etch stop film 28 (silicon oxide ($SiO_2$)) on the silicon nitride inner spacer sidewall 30.

Step 16: Remove Exposed Portions of Etch Stop Layer

FIG. 3O shows the device 60 of FIG. 3N after a selective, anisotropic, RIE step using sacrificial outside spacer layer 124 as a mask to remove the exposed portion of the etch stop layer 20 (preferably composed of $SiO_2$) stopping on the then exposed surface of raised Si layer 18.

Step 17: Extend Recess and Lower Height of Gate Electrode

FIG. 3O also shows the device 60 after, a different selective, anisotropic, RIE step is performed, also using the sacrificial outside spacer layer 124 as a mask, to remove the exposed portion of the raised silicon layer 18 stopping on the thin SiGe layer 16 and leaving a recess 140 below where recess 130 had been in FIG. 3N. At the same time, the height of the gate 32 is lowered to an equal degree to the raised silicon layer 18 forming a shortened gate 32', leaving the inner spacers 30 and the internal etch stop film 28 extending thereabove. In addition, the regions RE of the SiGe layer 16 are exposed between the raised silicon structures 18 and the shortened gate 32'.

Step 18: Strip Sacrificial Exterior Spacer Layer

FIG. 3O also shows the device 60 after an RIE step is performed to etch the exposed portion of the strip the sacrificial outside spacer layer 124 (preferably composed of silicon nitride) leaving the surface of the etch stop layer 20 exposed.

Step 19: Strip First Etch Stop Layer

FIG. 3P shows the device 60 of FIG. 3O with the shortened gate electrode 32' shown, in an intermediate stage of completion, after stripping the remainder of the first etch stop layer 20 (which had been protected by the sacrificial outside spacer layer 124) by an anisotropic RIE etching step. This leaves the surface of the raised silicon layer 18 exposed. If the first etch stop layer 20 is composed of silicon oxide ($SiO_2$), an anisotropic RIE step is performed to strip the etch stop layer 20. This etching step may also etch away some of the exposed portions of the internal etch stop film 28, which is exposed by the formation of the recess 129 in FIG. 3M, recess 130 in FIG. 3N and recess 140 in FIG. 3O.

Step 20: Lower Inner Sidewall Spacers

FIG. 3Q also shows the device 60 of FIG. 3P after performing an etch to lower the inner sidewall spacers 30 to the level of the shortened gate electrode 32', which was lowered in step 17.

The etch is preferably a wet etch if the inner sidewall spacers 30 are composed of silicon nitride.

In the above etching steps, the internal etch stop film 28 prevents etching into the inner sidewall spacer 30.

Step 21: Strip Internal Etch Stop Film

FIG. 3R shows the device 60 of FIG. 3Q after removal of the remainder of the internal etch stop film 28 leaving the inner sidewall spacers 30 exposed adjacent to the shortened gate electrode 32'. If the internal etch stop film 28 is composed of silicon oxide ($SiO_2$) the preferred method of stripping thereof is to perform a wet etch with a hydrogen fluoride bath.

Step 22: Halo Ion-Implantation

FIG. 3S shows the device 60 of FIG. 3R after angled halo ion-implantation under the edges of the gate electrode 32

Step 23: Extension Ion-Implantation

FIG. 3T shows the device 60 of FIG. 3S after extension ion-implantation with a vertical angle into the exposed surfaces of the device 60.

Figure 3U:
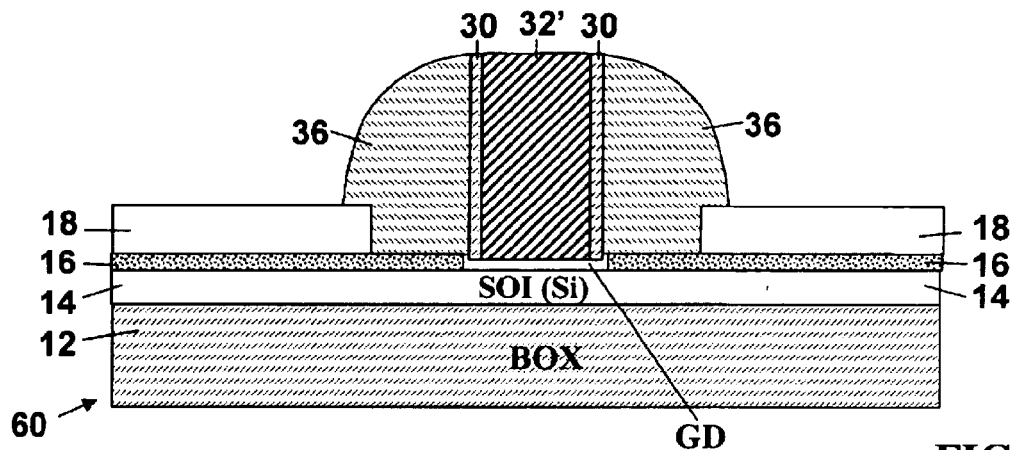

Step 24: Form External Sidewall Spacer FIG. 3U shows the device 60 of FIG. 3T after formation of external sidewall spacers 36 on the outer sidewalls of the inner sidewall spacers 30. The external sidewall spacers 36 are preferably composed of silicon nitride to control S/D diffusion.

Step 25: S/D Implantation

Figure 3V:
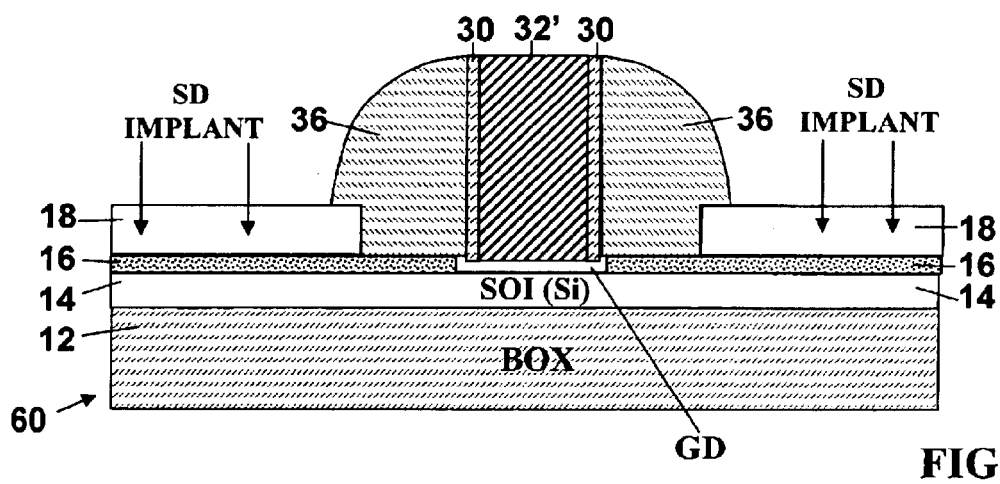

FIG. 3V shows the device 60 of FIG. 3U after a S/D ion implant of source/drain dopant into the raised Source/Drain (RSD) regions 18 on either side of the external sidewall spacers 36, as will be well understood by those skilled in the art.

Step 26: S/D Anneal.

Figure 3W:
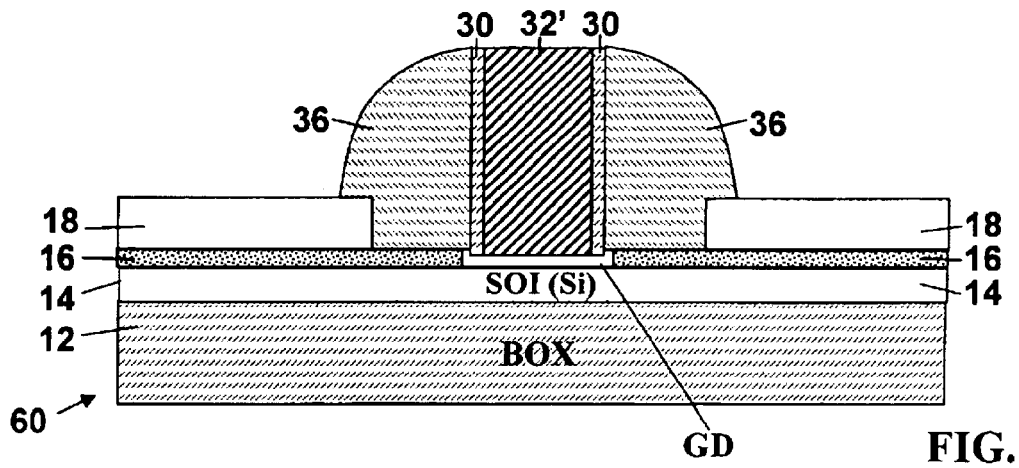

FIG. 3W shows the device 60 of FIG. 3V after a conventional S/D anneal of the RSD regions 18. FIG. 3W shows the device 60 of FIG. 3V after a conventional S/D anneal (preferably RTA, spike or non-melt laser anneal. After this step, one can follow conventional processing to finish the processing of the device (silicidation and making contacts, etc., as will be well understood by those skilled in the art. The recessed channel is located below the gate 32' in FIG. 3W in the SOI silicon 14 between the spacers 36.

While this invention has been described in terms of the above specific embodiment(s), those skilled in the art will recognize that the invention can be practiced with modification within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method of forming an FET device with a raised silicon source/drain and a gate electrode structure on an SOI structure comprising an silicon layer formed on a substrate wherein the substrate comprises an insulator by the following steps:

forming a SiGe layer over the silicon layer, forming a raised source/drain layer over the SiGe layer, etching through the raised source/drain layer and the SiGe layer to form a gate electrode space with walls reaching down through the raised source/drain layer and the SiGe layer to the surface of the silicon layer thereby forming a pair of raised source/drain regions separated by the gate electrode space in the source/drain layer, lining the walls of the gate electrode space with an internal etch stop layer and inner sidewall spacers, forming a gate electrode inside the inner sidewall spacers on a cleaned surface of the silicon layer, forming external sidewall spacers adjacent to the gate electrode between the raised source/drain regions adjacent to the inner sidewall spacers, and doping the source/drain regions, whereby a recessed channel is formed in the SOI silicon layer between the raised source/drain regions thereabove and below the level of the SiGe layer.

2. The method of claim 1 wherein an etch stop layer is formed on the surface of the raised source drain layer before forming the gate electrode space.

3. The method of claim 2 including the steps of forming the gate electrode space by the steps as follows:

forming a dummy gate over the source/drain layer, forming a conformal outside spacer layer over the dummy gate, forming an exterior masking layer over the outside spacer layer, etching back the exterior masking layer to expose the dummy gate, and removing the dummy gate to form the gate electrode space.

4. The method of claim 1 including the steps of forming the gate electrode space by the steps as follows:

forming a dummy gate over the source/drain layer, forming a conformal outside spacer layer over the dummy gate, forming an exterior masking layer over the outside spacer layer, etching back the exterior masking layer to expose the dummy gate, and removing the dummy gate to form the gate electrode space.

5. The method of claim 4 wherein the exterior masking layer is composed of silicon dioxide which covers the outside spacer layer until after filling the gate electrode space with the gate electrode and planarization thereof.

6. The method of claim 4 wherein:

an etch stop layer is formed on the surface of the raised source drain layer before forming the gate electrode space, and the exterior masking layer is composed of silicon germanium (SiGe) which covers the outside spacer layer until after filling the gate electrode space with the gate electrode and planarization thereof and after recessing the outside spacer layer down to the etch stop layer.

7. The method of claim 4 wherein:

an etch stop layer is formed on the surface of the raised source drain layer before forming the gate electrode space, and the exterior masking layer is composed of silicon germanium (SiGe) which covers the outside spacer layer until after filling the gate electrode space with the gate electrode and planarization thereof and after recessing the outside spacer layer down to the etch stop layer.

8. The method of claim 4 wherein:

an etch stop layer is formed on the surface of the raised source drain layer before forming the gate electrode space, the exterior masking layer is composed of silicon germanium (SiGe) which covers the outside spacer layer until after filling the gate electrode space with the gate electrode and planarization thereof and after recessing the outside spacer layer down to the etch stop layer, performing a raised source extension region and a raised drain extension region implant, and then forming an exterior spacer aside from the gate electrode.

9. The method of claim 1 wherein:

an etch stop layer is formed on the surface of the raised source drain layer before forming the gate electrode space;

forming the gate electrode space by forming a dummy/gate over the source/drain layer, forming a conformal outside spacer layer composed of silicon nitride over the dummy gate, forming an exterior masking layer over the outside spacer layer composed of SiGe, etching back the exterior masking layer to expose the dummy gate, and removing the dummy gate to form the gate electrode space.

10. The method of claim 1 wherein the insulator forming the substrate comprises silicon oxide.

11. A method of forming an FET device with a raised silicon source/drain and a gate electrode structure on an SOI structure comprising an silicon layer formed on a substrate wherein the substrate comprises an insulator by the following steps:

forming a SiGe layer over the silicon layer, forming a raised source/drain layer over the SiGe layer, forming an etch stop layer over the raised source/drain layer, forming a dummy gate over the source/drain layer, forming a conformal outside spacer layer over the dummy gate, forming an exterior masking layer over the outside spacer layer, etching back the exterior masking layer to expose the dummy gate, removing the dummy gate to form a gate electrode space, etching through the raised source/drain layer and the SiGe layer to form a gate electrode space with wails reaching down through the raised source/drain layer and the SiGe layer to the surface of the silicon layer thereby forming a pair of raised source/drain regions separated by the gate electrode space in the source/drain layer, lining the walls of the gate electrode space with an internal etch stop layer and inner sidewall spacers, forming a gate electrode inside the inner sidewall spacers on a cleaned surface of the silicon layer, forming external sidewall spacers adjacent to the inner sidewall spacers, and doping the source/drain regions, whereby a recessed channel is formed in the SOI silicon layer between the raised source/drain regions thereabove and below the level of the SiGe layer.

12. The method of claim 11 wherein the etch stop layer over the raised source/drain layer comprises silicon oxides.

13. The method of claim 11 including:

forming the exterior masking layer composed of silicon dioxide which covers the outside spacer layer until after filling the gate electrode space with the gate electrode, performing planarization of the gate electrode, and then stripping the exterior masking layer.

14. The method of claim 11 including:

forming the exterior masking layer of silicon germanium (SiGe) which covers the outside spacer layer until after filling the gate electrode space with the gate electrode and after planarization of the gate electrode, and then recessing the outside spacer layer down to the etch stop layer adjacent to the gate electrode.

15. The method of claim 11 wherein the insulator forming the substrate comprises silicon oxide.

16. The method of claim 11 wherein:

the exterior masking layer is composed of silicon germanium (SiGe) which covers the outside spacer layer until after filling the gate electrode space with the gate electrode and planarization thereof and after recessing the outside spacer layer down to the etch stop layer, then performing an extension implant to form a raised source extension region and a raised drain extension region, and then forming an exterior spacer aside from the gate electrode.

17. The method of claim 16 wherein the internal etch stop layer is stripped away after forming the recess and before performing the extension implant.

18. The method of claim 17 wherein a halo implant is performed contemporaneously with the extension implant.

19. The method of claim 16 wherein the external sidewall spacers fill the recess.

* * * * *